(12) United States Patent
Baek et al.

(10) Patent No.: US 9,281,277 B2
(45) Date of Patent: Mar. 8, 2016

(54) METHODS OF FORMING WIRING STRUCTURES

(71) Applicant: Samsung Electronics Co., Ltd., Suwon-si, Gyeonggi-do (KR)

(72) Inventors: Jong-Min Baek, Suwon-si (KR); Sang-Ho Rha, Seongnam-si (KR); Woo-Kyung You, Suwon-si (KR); Sang-Hoon Ahn, Goyang-si (KR); Nae-In Lee, Seoul (KR); Ki-Chul Kim, Seongnam-si (KR); Jeon-Il Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/527,842

(22) Filed: Oct. 30, 2014

(65) Prior Publication Data

US 2015/0179582 A1    Jun. 25, 2015

(30) Foreign Application Priority Data

Dec. 23, 2013 (KR) .......................... 10-2013-0161485

(51) Int. Cl.
*H01L 23/528* (2006.01)
*H01L 23/532* (2006.01)
*H01L 21/768* (2006.01)
*H01L 23/522* (2006.01)

(52) U.S. Cl.
CPC ...... *H01L 23/53238* (2013.01); *H01L 21/7684* (2013.01); *H01L 21/76843* (2013.01); *H01L 21/76879* (2013.01); *H01L 21/76883* (2013.01); *H01L 23/528* (2013.01); *H01L 23/5222* (2013.01); *H01L 23/53295* (2013.01); *H01L 23/5329* (2013.01); *H01L 23/53223* (2013.01); *H01L 23/53266* (2013.01); *H01L 2924/0002* (2013.01)

(58) Field of Classification Search
CPC ............ H01L 23/53238; H01L 23/528; H01L 21/76843; H01L 21/76879; H01L 21/7684; H01L 21/76883
See application file for complete search history.

(56) References Cited

U.S. PATENT DOCUMENTS

| | | | | |
|---|---|---|---|---|
| 7,741,228 B2 * | 6/2010 | Ueki | ................... | H01L 21/7682 257/E21.573 |
| 7,842,600 B2 * | 11/2010 | Yun | ..................... | H01L 21/7682 257/E21.581 |
| 7,879,683 B2 * | 2/2011 | Al-Bayati | ........... | H01L 21/3105 257/E21.573 |
| 8,084,352 B2 * | 12/2011 | Harada | ............... | H01L 21/7682 257/E21.577 |

(Continued)

FOREIGN PATENT DOCUMENTS

| | | |
|---|---|---|
| JP | 2009-135172 | 6/2009 |
| KR | 1020130115935 A | 10/2013 |

*Primary Examiner* — Bilkis Jahan
(74) *Attorney, Agent, or Firm* — Myers Bigel & Sibley, P.A.

(57) ABSTRACT

A wiring structure includes a first insulation layer, a plurality of wiring patterns, a protection layer pattern and a second insulation layer. The first insulation layer may be formed on a substrate. A plurality of wiring patterns may be formed on the first insulation layer, and each of the wiring patterns may include a metal layer pattern and a barrier layer pattern covering a sidewall and a bottom surface of the metal layer pattern. The protection layer pattern may cover a top surface of each of the wiring patterns and including a material having a high reactivity with respect to oxygen. The protection layer pattern may cover a top surface of each of the wiring patterns and including a material having a high reactivity with respect to oxygen.

12 Claims, 17 Drawing Sheets

(56) References Cited

U.S. PATENT DOCUMENTS

| | | | | |
|---|---|---|---|---|
| 8,258,627 B2 * | 9/2012 | Budrevich | H01L 21/7682 | 257/751 |
| 8,310,053 B2 * | 11/2012 | Verheijden | B81C 1/00476 | 257/758 |
| 8,344,474 B2 * | 1/2013 | Seidel | H01L 21/76816 | 257/522 |
| 2007/0218677 A1 * | 9/2007 | Engelhardt | H01L 21/76849 | 438/618 |
| 2008/0124917 A1 * | 5/2008 | Oh | H01L 21/76885 | 438/637 |
| 2009/0093100 A1 * | 4/2009 | Xia | C23C 16/325 | 438/421 |
| 2010/0133648 A1 | 6/2010 | Seidel et al. | | |

* cited by examiner

⊗ → SECOND
FIRST   DIRECTION
DIRECTION

⊗ → SECOND
FIRST   DIRECTION
DIRECTION

METHODS OF FORMING WIRING STRUCTURES

CROSS-REFERENCE TO RELATED APPLICATION

This application claims priority under 35 USC §119 to Korean Patent Application No. 10-2013-0161485, filed on Dec. 23, 2013 in the Korean Intellectual Property Office (KIPO), the contents of which are herein incorporated by reference in their entirety.

BACKGROUND

Example embodiments relate to wiring structures and methods of forming the same. More particularly, example embodiments relate to wiring structures including an air gap and methods of forming the same.

As semiconductor devices have been highly integrated, a distance between wiring structures has been reduced, and thus, a parasitic capacitance therebetween has been increased. Therefore, it is desired to develop a wiring structure having a low resistance and a low parasitic capacitance.

SUMMARY

Example embodiments provide wiring structures.

Example embodiments provide methods of forming a wiring structure.

According to some example embodiments, there is provided a wiring structure. The wiring structure includes a first insulation layer, multiple wiring patterns, a protection layer pattern and a second insulation layer. The first insulation layer may be formed on a substrate. Multiple wiring patterns may be formed on the first insulation layer, and each of the wiring patterns may include a metal layer pattern and a barrier layer pattern covering a sidewall and a bottom surface of the metal layer pattern. The protection layer pattern may cover a top surface of each of the wiring patterns and including a material having a high reactivity with respect to oxygen. The protection layer pattern may cover a top surface of each of the wiring patterns and including a material having a high reactivity with respect to oxygen.

In some embodiments, the protection layer pattern may include a metal and/or a metal nitride.

In some embodiments, the protection layer pattern may include aluminum nitride or cobalt.

According to some embodiments, there are provided methods of a wiring structure. A first insulation layer may be formed on a substrate to have a trench thereon. A barrier layer may be formed on a sidewall and a bottom surface of the trench and an upper surface of the first insulation layer. A metal layer may be formed on the barrier layer to fill the trench. Upper portions of the metal layer and the barrier layer may be planarized until the upper surface of the first insulation layer is exposed to form a metal layer pattern having a first oxide layer thereon and a barrier layer pattern having a second oxide layer thereon. A UV pre-treatment process may be performed using UV and a reducing gas on the metal layer pattern and the barrier layer pattern to remove the first and second oxide layers thereon, respectively, so as to form multiple wiring patterns each of which includes the barrier layer pattern and the metal layer pattern. A protection layer pattern may be formed to directly cover a top surface of each wiring pattern, the protection layer pattern including a material having a high reactivity with respect to oxygen. The first insulation layer may be partially removed to form a recess between the wiring patterns. A second insulation layer may be formed on the protection layer pattern and the first insulation layer to form an air gap between the wiring patterns.

In some embodiments, the UV pre-treatment process and forming the protection layer pattern may be performed in a vacuum chamber In some embodiments, the reducing gas may include hydrogen gas and/or ammonia gas In some embodiments, the UV pre-treatment process may be performed at a temperature of about 250° C. to about 400° C.

In some embodiments, after performing the UV pre-treatment process, a plasma treatment process may be further performed using ammonia gas In some embodiments, the UV pre-treatment process and the plasma treatment process may be performed in vacuum chambers different from each other.

In some embodiments, the barrier layer may be formed to include at least one of Ta, TaN, TaC, TaCN, Ti, TiN and WN.

In some embodiments, the metal layer may include copper.

In some embodiments, the protection layer pattern may be formed to include copper or copper nitride.

In some embodiments, when the protection layer pattern is formed, the protection layer pattern may be formed using a metal nitride on the top surface of each of the wiring patterns and forming a sacrificial layer pattern including a metal oxynitride on the first insulation layer.

In some embodiments, when the protection layer pattern is formed, a chemical vaporization deposition (CVD) process may be performed using an aluminum nitride precursor to form the sacrificial layer pattern including aluminum oxynitride and the protection layer pattern including aluminum nitride.

In some embodiments, the sacrificial layer pattern may be partially etched prior to partially removing the first insulation layer According to some embodiments, there are provided wiring structures including an air gap and having a low resistance in a highly integrated semiconductor device. In some embodiments, a wiring structure includes a first insulation layer on a substrate, the first insulation structure including multiple recesses formed therein. Some embodiments include multiple wiring patterns on the first insulation layer, ones of the wiring patterns including a metal layer pattern and a barrier layer pattern covering a sidewall and a bottom surface of the metal layer pattern. Some embodiments provide that ones of the wiring patterns are configured to be formed in respective ones of the recesses.

Some embodiments include a protection layer pattern covering a top surface of each of the wiring patterns and that includes a material having a high reactivity with respect to oxygen and a second insulation layer on non-recessed surfaces of the first insulation layer and on the protection layer pattern. In some embodiments, the second insulation layer includes multiple air gaps, ones of which are arranged between ones of the wiring patterns.

Some embodiments include an upper insulation layer formed on the second insulation layer. In some embodiments, the protection layer pattern includes a metal and/or a metal nitride. Some embodiments provide that the protection layer pattern includes aluminum nitride and/or cobalt. In some embodiments, the wiring patterns each extend in a first direction and are spaced apart in a second direction that is substantially perpendicular to the first direction.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below

BRIEF DESCRIPTION OF THE DRAWINGS

Example embodiments will be more clearly understood from the following detailed description taken in conjunction with the accompanying drawings. FIGS. 1 to 31 represent non-limiting, example embodiments as described herein.

FIGS. 2 to 10 are cross-sectional views illustrating stages of a method of forming a wiring structure in accordance with some example embodiments.

FIG. 11 is a cross-sectional view illustrating a wiring structure in accordance with some example embodiments.

FIGS. 12 to 17 are cross-sectional views illustrating stages of a method of forming a wiring structure in accordance with some example embodiments.

FIG. 18 is a cross-sectional view illustrating a wiring structure in accordance with some example embodiments.

FIGS. 19 and 20 are cross-sectional views illustrating stages of a method of forming a wiring structure in accordance with some example embodiments.

FIGS. 22 to 24 are cross-sectional views illustrating stages of a method of forming a wiring structure in accordance with some example embodiments.

FIG. 25 is a cross-sectional view illustrating a wiring structure in accordance with some example embodiments.

FIGS. 26 to 29 are cross-sectional views illustrating stages of a method of forming a wiring structure in accordance with some example embodiments.

FIG. 30 is a graph illustrating contents of oxygen in aluminum nitride layers and tantalum layers in Example 1 and Comparative Example 1.

FIG. 31 is a graph illustrating yields of via chain pattern structures in Example 2 and Comparative Example 2.

DESCRIPTION OF EMBODIMENTS

Figure 1A:
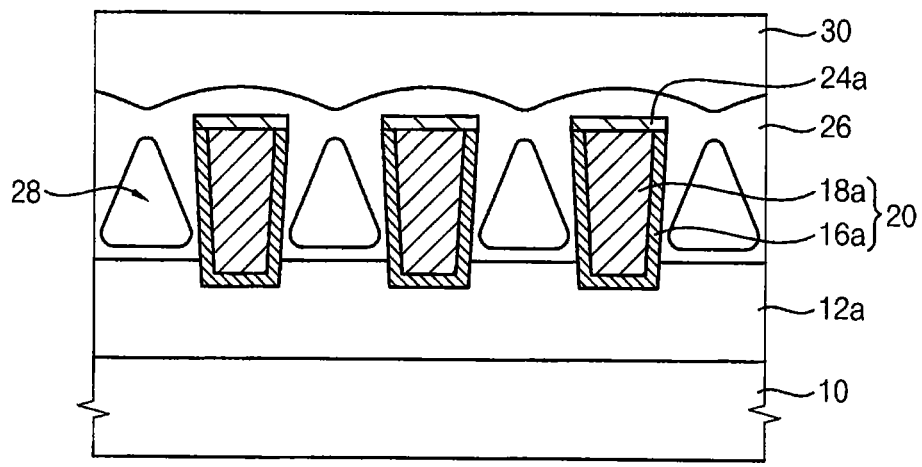
FIG. 1A is a cross-sectional view illustrating a wiring structure in accordance with some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
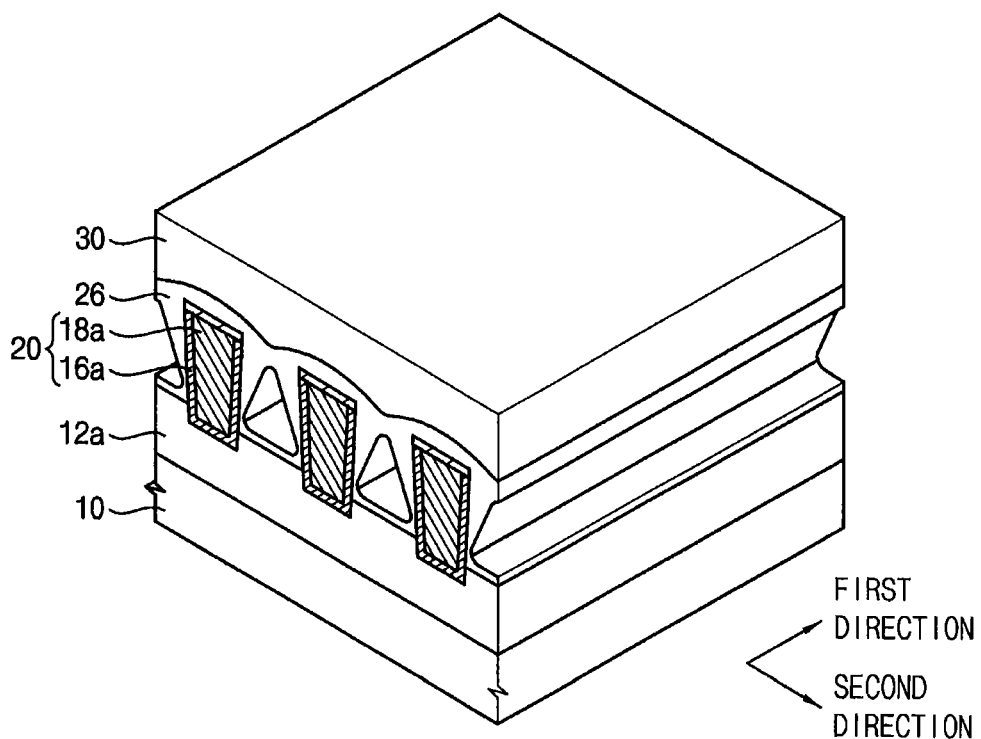
FIG. 1B is a perspective view of the wiring structure in FIG. 1A.

FIG. 1A is a cross-sectional view illustrating a wiring structure in accordance with example embodiments, and FIG. 1B is a perspective view of the wiring structure in FIG. 1A.

Referring to FIGS. 1A and 1B, the wiring structure may have a wiring pattern 20 including a barrier layer pattern 16a and a metal layer pattern 18a, a protection layer pattern 24a and a second insulation layer 26 including an air gap 28 therein. Lower devices (not shown) may be formed on a substrate 10. A lower insulating interlayer (not shown) may cover the lower devices. The lower devices may include a metal oxide semiconductor (MOS) transistor, a diode, and/or wires connected thereto.

A first insulation layer 12a may be formed on the substrate 10. The first insulation layer 12a may include a material having a dielectric constant lower than that of silicon oxide, which may be about 4.0. For example, the dielectric constant of the material in the first insulation layer 12a may be lower than about 3.5. In some embodiments, the first insulation layer 12a may include silicon oxide.

The wiring pattern 20 may be formed on the first insulation layer 12a and may include the barrier layer pattern 16a and the metal layer pattern 18a. The metal layer pattern 18a may have a linear shape extending in a first direction substantially parallel to a top surface of the substrate 10. The barrier layer pattern 16a may cover a sidewall and a bottom surface of the metal layer pattern 18a.

In some example embodiments, a plurality of metal layer patterns 18a may be formed, which may be spaced apart from each other in a second direction substantially parallel to the top surface of the substrate 10 and substantially perpendicular to the first direction. Accordingly, a plurality of barrier layer patterns 16a may be formed, which may be spaced apart from each other in the second direction.

Some embodiments provide that the wiring pattern 20 including the barrier layer pattern 16a and the metal layer pattern 18a may serve as a contact plug.

The metal layer pattern 18a may include copper, tungsten, aluminum, etc. In some embodiments, the metal layer pattern 18a may include copper.

The barrier layer pattern 16a may include a metal and/or a metal nitride, e.g., tantalum, tantalum nitride, tantalum nitride, titanium, titanium nitride, tungsten nitride, etc. These may be used alone and/or in a combination thereof. In some example embodiments, the barrier layer pattern 16a may include a tantalum layer and a tantalum nitride layer sequentially stacked. When the metal layer pattern 18a includes copper, the barrier layer pattern 16a may include tantalum so as to prevent copper in the metal layer pattern 18a from diffusing.

The protection layer pattern 24a may cover top surfaces of the barrier layer pattern 16a and the metal layer pattern 18a.

The protection layer pattern 24a may include, e.g., a metal or a metal nitride. The protection layer pattern 24a may include a material containing no oxide or a very small amount of oxide therein. The material of the protection layer pattern 24a may have a high reactivity with respect to oxygen so that the material may be converted into a different material when the material is formed on a layer including oxygen. In some example embodiments, the protection layer pattern 24a may include aluminum nitride. Alternatively, the protection layer pattern 24a may include a material containing cobalt, e.g., Co, CoSi$_2$, CoWP, CoPRu, etc.

The protection layer pattern 24a may protect the metal layer pattern 18a in an etching process. Particularly, the protection layer pattern 24a may prevent a wet etching solution from penetrating into the metal layer pattern 18a. The protection layer pattern 24a may have a thickness of about 10 Å to about 100 Å. If a thickness of the protection layer pattern 24a is less than about 10 Å, the metal layer pattern 18a may not be sufficiently protected. If the thickness of the protection layer pattern 24a is greater than about 100 Å, other structures for forming a semiconductor device may not be easily formed. Thus, the protection layer pattern 24a may have a thickness of about 30 Å to about 50 Å.

The second insulation layer 26 may cover a top surface of the protection layer pattern 24a, and may define at least an upper surface of the air gap 28 between a plurality of wiring patterns 20. In example embodiments, a plurality of air gaps 28 may be formed, and may be spaced apart from each other in the second direction. The air gap 28 may extend in the first direction because each of the wiring patterns 20 may extend in the first direction. The second insulation layer 26 may be formed on sidewalls of the wiring patterns 20 and a top surface of the first insulation layer 12a, and in this case, the second insulation layer 26 may define a lower surface of the air gap 28 as well.

The second insulation layer 26 may include an insulation material having poor step coverage characteristics. The second insulation layer 26 may include a material having a dielectric constant lower than that of silicon oxide and a good elasticity, which may include, e.g., SiCN.

An upper insulating interlayer 30 may be formed on the second insulation layer 26.

The air gap 28 may be filled with an air having a low dielectric constant. The air gap 28 may have a dielectric constant lower than about 2, and thus, a parasitic capacitance between the wiring patterns 20 may be very small. In addition, the protection layer pattern 24a including a metal or a metal nitride may be formed on the top surfaces of the barrier layer pattern 16a and the metal layer pattern 18a, and thus the metal layer pattern 18a may not be corroded in an etching process for forming the air gap 28 because of the protection layer pattern 24a. Therefore, the wiring pattern 20 may have a low resistance.

FIGS. 2 to 10 are cross-sectional views illustrating stages of methods of forming a wiring structure in accordance with some example embodiments.

Figure 2:
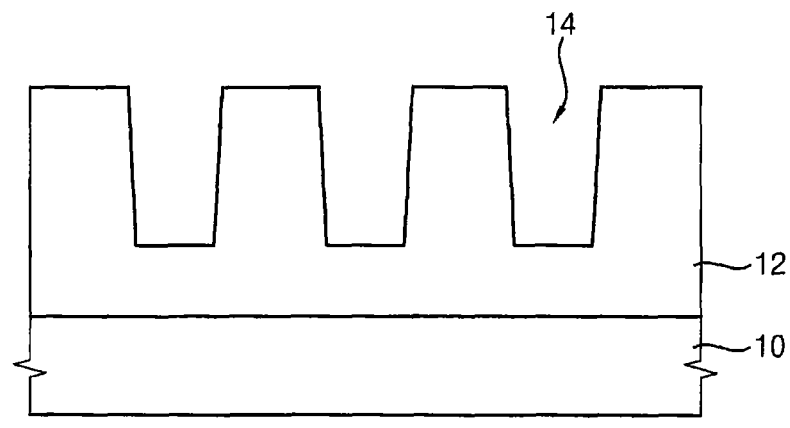

Referring to FIG. 2, a substrate 10 may be provided. The substrate 10 may be a semiconductor substrate. Lower devices (not shown) may be formed on the substrate 10 by a front end of line (FEOL) process.

A first preliminary insulation layer 12 may be formed on the substrate 10. The first preliminary insulation layer 12 may be formed to include a material having a dielectric constant lower than that of silicon oxide which may be about 4.0. For example, the dielectric constant of the first preliminary insulation layer 12 may be lower than about 3.5. In some embodiments, the first preliminary insulation layer 12 may be formed to include silicon oxide.

In some example embodiments, the first preliminary insulation layer 12 may be formed by a chemical vapor deposition (CVD) process or a plasma enhanced chemical vapor deposition (PECVD) process using, e.g., SiCHO or SiOC.

A portion of the first preliminary insulation layer 12 may be etched to form a trench 14. A width and a depth of the trench 14 may be adjusted in accordance with a width and a height of a wiring pattern 20 that may be subsequently formed.

The trench 14 may be formed by a photolithography process. In some example embodiments, a plurality of trenches 14 may be formed to be spaced apart from each other in a second direction substantially parallel to a top surface of the substrate 100. The trench 14 may have a tapered shape, i.e. a shape becoming narrower from an upper portion toward a lower portion thereof. In some embodiments, the trench 14 may be formed to include a sidewall substantially perpendicular to the top surface of the substrate 100. Hereinafter, only the trench 14 having the tapered shape may be illustrated, for the convenience of explanation.

Figure 3:
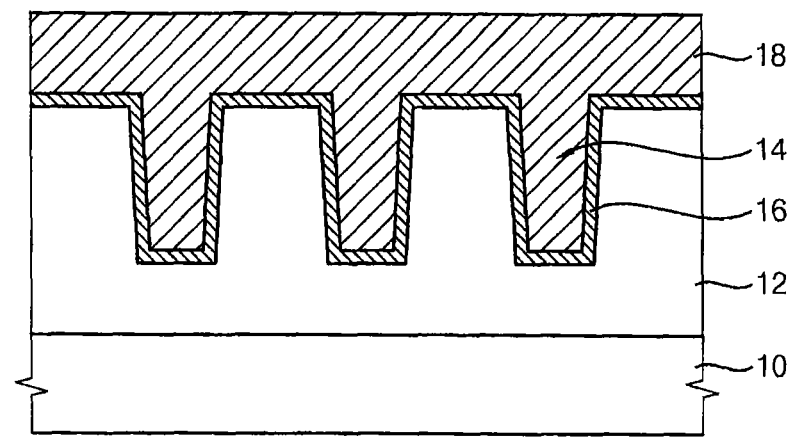

Referring to FIG. 3, a barrier layer 16 may be conformally formed on an inner wall of the trench 14 and a top surface of the first preliminary insulation layer 12.

The barrier layer 16 may be formed to include a metal and/or a metal nitride, e.g., Ta, Ti, W, TaN, TiN, WN, etc. In some embodiments, the barrier layer 16 may be formed to include a metal carbonitride, e.g., TaCN. In some example embodiments, the barrier layer 16 may be formed to have a multi-layered structure including a metal nitride layer and a metal layer sequentially stacked, e.g., a tantalum nitride layer and a tantalum layer sequentially stacked.

A metal layer 18 may be formed on the barrier layer 16. The metal layer 18 may be formed by an electro-chemical plating process or an electroplating process using a metal, e.g., copper, tungsten, aluminum, etc. In some embodiments, the metal layer 18 may be formed to include copper. The metal layer 18 may be over-deposited so as to sufficiently fill the trench 14. The metal in the metal layer 18 may be effectively prevented from diffusing into the first preliminary insulation layer 12 because of the barrier layer 16. The diffusion of the metal may be prevented more effectively when the barrier layer 16 includes a multi-layered structure of a tantalum nitride layer and a tantalum layer.

Figure 4:
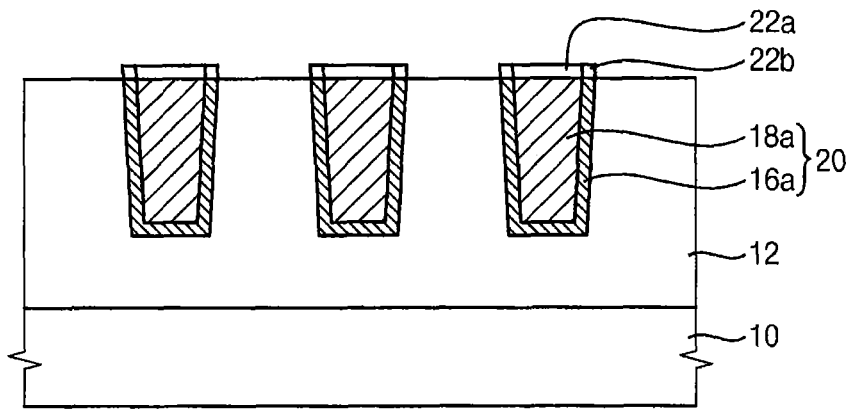

Referring to FIG. 4, the barrier layer 16 and the metal layer 18 may be planarized to expose the top surface of the first preliminary insulation layer 12 by a chemical mechanical planarization (CMP) process and/or an etch back process to form a barrier layer pattern 16a and a metal layer pattern 18a, respectively. Hereinafter, a conductive structure including the barrier layer pattern 16a and the metal layer pattern 18a may be referred as the wiring pattern 20.

Exposed portions of the barrier layer pattern 16a and the metal layer pattern 18a may be naturally oxidized so that a first oxide layer 22a and a second oxide layer 22b may be formed on top surfaces of the metal layer pattern 18a and the barrier layer pattern 16a, respectively. Materials of the first and second oxide layers 22a and 22b may vary in accordance with materials in the barrier layer pattern 16a and the metal layer pattern 18a therebeneath, respectively. In some example embodiments, the first oxide layer 22a may include a copper oxide ($CuO_x$) layer, and the second oxide layer 22b may include a tantalum oxide ($TaO_x$) layer.

Figure 5:
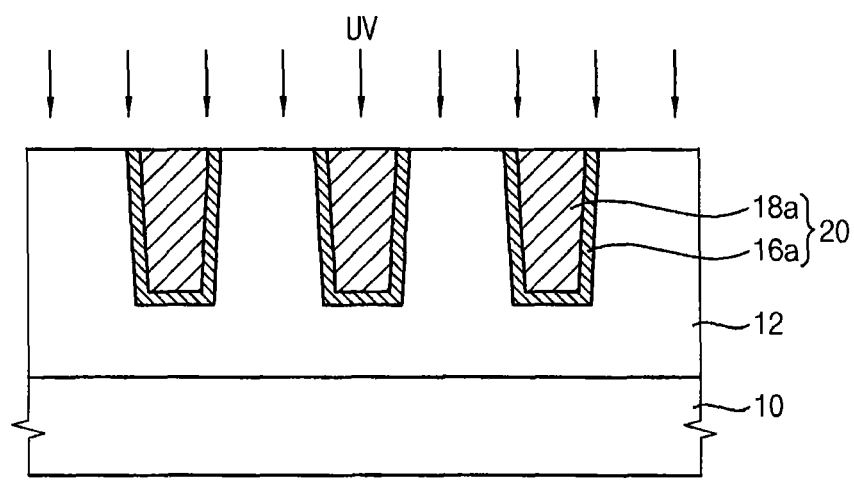

Referring to FIG. 5, the first and second oxide layers 22a and 22b may be sufficiently removed by an ultraviolet (UV) pre-treatment process in a vacuum chamber (not shown).

The UV pre-treatment process may be performed so that UV may be radiated onto the barrier layer pattern 16a and the metal layer pattern 18a. In the UV pre-treatment process, a reducing gas including, e.g., ammonia gas and/or hydrogen gas may be injected into the vacuum chamber in order to remove the first and second oxide layers 22a and 22b.

The UV may be radiated a plurality of times, and each of the UV radiation may be performed under conditions including, e.g., intensity, power, power density, radiation time, wavelength, etc., which may be substantially the same as or different from each other.

The UV pre-treatment process may include radiation of a UV light using a UV lamp, a UV light emitting diode (LED) and/or a UV laser. The UV light may be a continuous light or a pulse-type light. The UV light may have a broadband wavelength or a narrowband wavelength. The wavelength of the UV light may be within a range of about 100 nm to about 600 nm. The UV pre-treatment process may be performed at a temperature of about 250° C. to about 400° C.

Oxygen in the first and second oxide layers 22a and 22b may be sufficiently removed because of the hydrogen gas and/or the ammonia gas injected into the vacuum chamber. In some example embodiments, oxygen in $CuO_x$ and $TaO_x$ may be removed so that the $CuO_x$ and the $TaO_x$ may be reduced to Cu and Ta, respectively.

Some embodiments provide that the UV pre-treatment process may activate reducing reactions of $CuO_x$ and $TaO_x$.

An activation energy of the reducing reaction of $CuO_x$ may be less than about 0 so that the reducing reaction of $CuO_x$ may rapidly occur. However, an activation energy of the reducing reaction of $TaO_x$ may be greater than about 0 so that the reducing reaction of $TaO_x$ may occur slowly, or the reducing reaction may not occur. Thus, $TaO_x$ may not be easily removed.

When the UV pre-treatment process is performed, however, oxygen in $TaO_x$ may be sufficiently removed because a high energy may be provided to activate the reducing reaction of $TaO_x$ during the UV pre-treatment process. Therefore, the first and second oxide layers 22a and 22b may be sufficiently removed by the above process. When the first and second oxide layers 22a and 22b are not sufficiently removed, a protection layer pattern 24a (refer to FIG. 6) may be formed to have defects in a subsequent process, and thus, the first and second oxide layers 22a and 22b may be required to be sufficiently removed.

Figure 6:
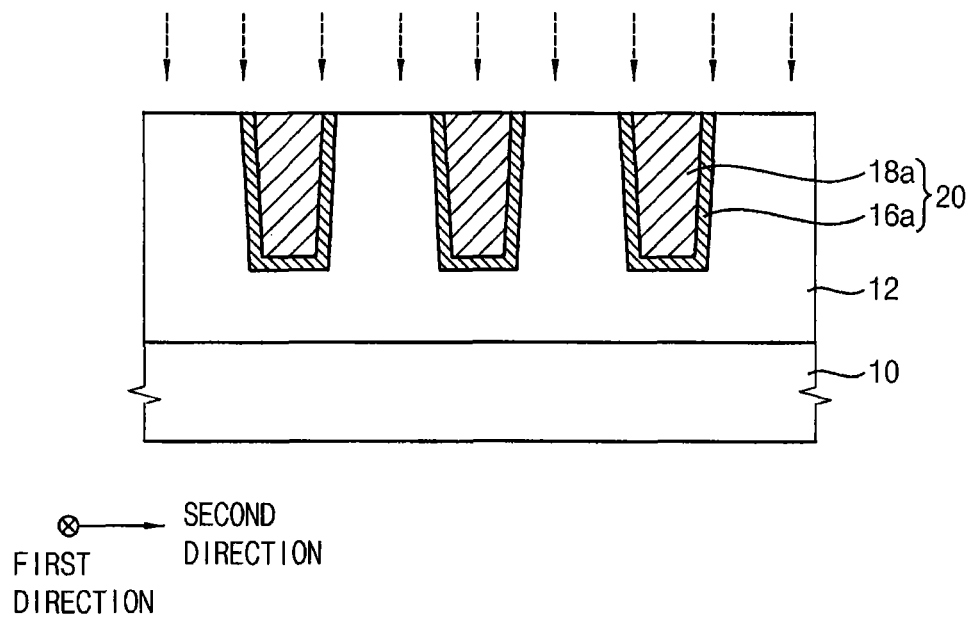

Referring to FIG. 6, an ammonia plasma treatment process may be performed in a vacuum chamber (not shown). In some example embodiments, the ammonia plasma treatment process may be performed at a temperature in a range of about 250° C. to about 500° C. in the vacuum chamber different from that of the UV pre-treatment process.

The ammonia plasma treatment process may be optionally performed in order to remove the first and second oxide layers 22a and 22b. When most of the first and second oxide layers 22a and 22b are removed in the UV pre-treatment process, the ammonia plasma treatment process may not be performed.

When the first and second oxide layers 22a and 22b remain after the UV pre-treatment process, reducing reactions of the first and second oxide layers 22a and 22b may occur by the ammonia plasma treatment process. Therefore, the first and second oxide layers 22a and 22b may be sufficiently removed.

In some embodiments, the ammonia plasma treatment process may be performed prior to the UV pre-treatment process.

Figure 7:
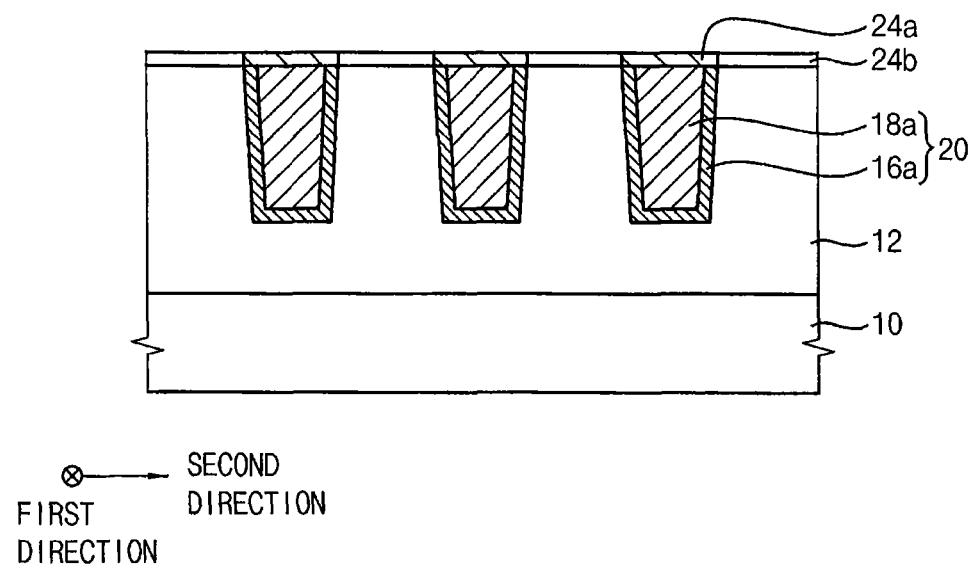

Referring to FIG. 7, the protection layer pattern 24a may be formed on the barrier layer pattern 16a and the metal layer pattern 18a, and a sacrificial layer pattern 24b may be formed on the first preliminary insulation layer 12 by a deposition process.

The deposition process may be performed using a material having a high reactivity with respect to oxygen so as to form a layer having materials different from each other according to a material included in an underlying layer. For example, the protection layer pattern 24a may be formed to include a metal and/or a metal nitride because the barrier layer pattern 16a and the metal layer pattern 18a beneath the protection layer pattern 24a may include no oxygen, while the sacrificial layer pattern 24b may be formed to include a metal oxide and/or a metal oxynitride because the first preliminary insulation layer 12 beneath the sacrificial layer pattern 24b may include oxygen. The protection layer pattern 24a and the sacrificial layer pattern 24b may be formed to include materials which may be selectively etched by a wet etching process. The protection layer pattern 24a may be formed to have a thickness of about 10 Å to about 100 Å. In some example embodiments, the protection layer pattern 24a may have a thickness of about 30 Å to about 50 Å.

In some example embodiments, an aluminum nitride precursor may be deposited on the barrier layer pattern 16a, the metal layer pattern 18a and the first preliminary insulation layer 12 by a CVD process so as to form the protection layer pattern 24a and the sacrificial layer pattern 24b. The barrier layer pattern 16a and the metal layer pattern 18a may include no oxygen so that the protection layer pattern 24a thereon may be formed to include aluminum nitride. The aluminum nitride in the protection layer pattern 24a may include no oxygen or a very small amount of oxygen. The first preliminary insulation layer 12 may include oxygen so that the sacrificial layer pattern 24b thereon may be formed to include aluminum oxynitride.

When the first and second oxide layers 22a and 22b remain on the barrier layer pattern 16a and the metal layer pattern 18a, however, the protection layer pattern 24a may be formed to include aluminum oxynitride because of oxygen in the first and second oxide layers 22a and 22b. The aluminum oxynitride may be easily removed in a subsequent process, and thus, the top surface of the metal layer pattern 18a may be exposed after the subsequent process so as not to be protected. Therefore, the first and second oxide layers 22a and 22b may be required to be sufficiently removed from the top surfaces of a wiring pattern 20 including the metal layer pattern 18a and the barrier layer pattern 16a in order not to form aluminum oxynitride.

In some example embodiments, the first and second oxide layers 22a and 22b may be sufficiently removed, and thus, the protection layer pattern 24a may cover the top surface of wiring pattern 20. Thus, defects may not be generated in the semiconductor device including the wiring pattern 20 because of the protection layer pattern 24a including metal nitride on the wiring pattern 20.

Figure 8:
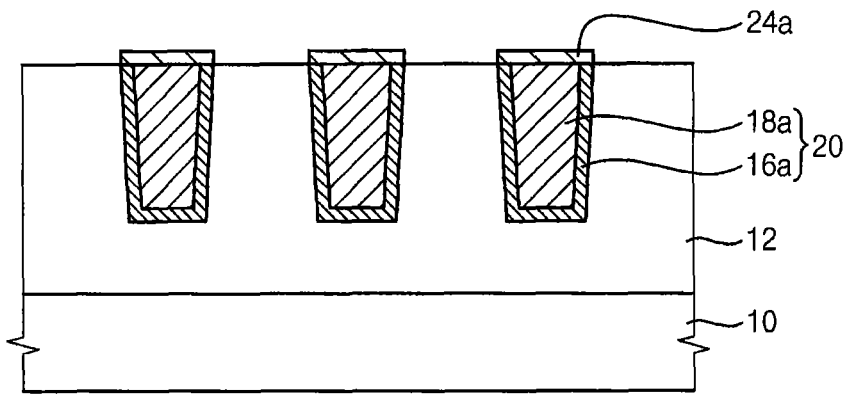

Referring to FIG. 8, the sacrificial layer pattern 24b may be removed. The sacrificial layer pattern 24b may be removed by a wet etching process and/or a dry etching process. In some example embodiments, the sacrificial layer pattern 24b may be removed by the wet etching process in order to prevent the metal layer pattern 18a from being damaged by plasma used in a dry etching process. For example, the wet etching process may be performed using a diluted HF solution as an etching solution in order to sufficiently etch the sacrificial layer pattern 24b without etching the protection layer pattern 24a.

Figure 9:
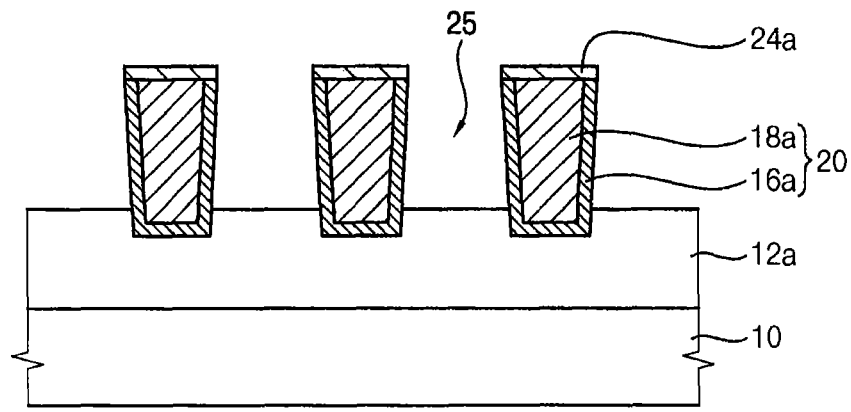

Referring to FIG. 9, upper portions of the first preliminary insulation layer 12 may be etched to form a first insulation layer 12a. That is, the upper portions of the first preliminary insulation layer 12 between the wiring patterns 20 may be removed to form a plurality of recesses 25 between the wiring patterns 20. The etch process may be performed by a wet etching process and/or a dry etching process. In some example embodiments, the upper portions of the first preliminary insulation layer 12 may be removed by the wet etching process in order to prevent the metal layer pattern 18a from being damaged by plasma used in a dry etching process. For example, the wet etching process may be performed using a diluted HF solution as an etching solution. In some embodiments, the upper portion of the first preliminary insulation layer 12 may be removed together with the sacrificial layer pattern 24b using the diluted HF solution as the etching solution.

Each recess 25 may be formed to have a bottom surface between half of a height of the wiring pattern 20 and a lower surface of the wiring pattern 20. The wiring patterns 20 may be spaced apart from each other by the recesses 25 on the first insulation layer 12a.

The protection layer pattern 24a and the barrier layer pattern 16a may cover the metal layer pattern 18a so that an upper portion of the metal layer pattern 18a and the sidewall of the metal layer pattern 18a may be protected by the protection layer pattern 24a and the barrier layer pattern 16a, respectively. Thus, the metal layer pattern 18a may not be corroded during the etching process.

Figure 10:
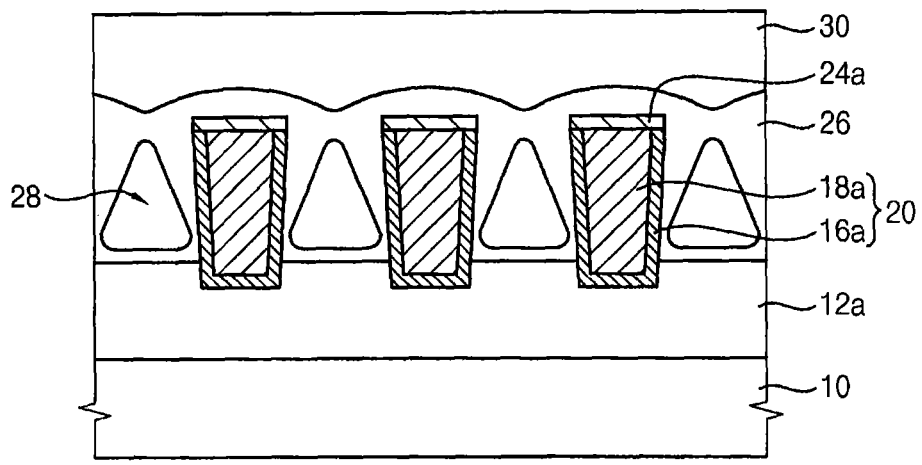

Referring to FIG. 10, a second insulation layer 26 may be formed to include an air gap 28 between the wiring patterns 20 on the first insulation layer 12a and the protection layer pattern 24a. In some example embodiments, a plurality of air gaps 28 may be formed to be spaced apart from each other between the wiring patterns 20 by forming the second insulation layer 26. The air gap 28 may be formed to extend in the first direction.

The second insulation layer 26 may be formed using a material having poor step coverage characteristics on the first insulation layer 12a and the protection layer pattern 24a. The second insulation layer 26 may be formed to include a material having a dielectric constant lower than that of silicon oxide and a good elasticity, e.g., SiCN. A portion of the second insulation layer 26 on the protection layer pattern 24a may be formed to have a thickness greater than a portion of the second insulation layer 26 on the sidewall of the wiring pattern 20 and the bottom surfaces of the recesses 25. In this case, the air gap 28 may be formed have a size greater than a conventional air gap between the wiring patterns 20.

An upper insulating interlayer 30 may be formed on the second insulation layer 26.

The air gap 28 may be formed between the wiring patterns 20 so that a parasitic capacitance therebetween may be reduced. A damage or corrosion of the metal layer pattern 18a may be minimized during the process for forming the air gap 28, and thus, defects of the semiconductor device may be reduced.

Hereinafter, other methods of forming the wiring structure may be illustrated.

Processes substantially the same as or similar to those illustrated with reference to FIGS. 2 to 6 may be performed to remove a first oxide layer 22a and a second oxide layer 22b on a metal layer pattern 18a and a barrier layer pattern 16a, respectively.

A protection layer pattern 24a may be formed on the barrier layer pattern 16a and the metal layer pattern 18a by a deposition process in a vacuum chamber. In this case, no layer may be formed on the first preliminary insulation layer 12.

Particularly, a material may be selectively deposited on the barrier layer pattern 16a and the metal layer pattern 18a by the deposition process to form the protection layer pattern 24a, which may have a high reactivity with respect to a conductive material. That is, the material may be formed only on the barrier layer pattern 16a and the metal layer pattern 18a including a metal, and may not be formed on the first preliminary insulation layer 12 including no metal. The protection layer pattern 24a may be formed to include a metal. In some example embodiments, the protection layer pattern 24a may be formed to include a metal containing cobalt, e.g., Co, $CoSi_2$, CoWP, CoPRu, etc.

In some example embodiments, the protection layer pattern 24a may be formed by, e.g., an electroless plating process. Particularly, a material containing water may be selectively adsorbed onto the first preliminary insulation layer 12, and the protection layer pattern 24a may be formed by the electroless plating process. The first preliminary insulation layer 12 including the material thereon may be hydrophilic so that the protection layer pattern 24a having a hydrophobic characteristic may not be formed on the first preliminary insulation layer 12. Thus, the protection layer pattern 24a may be formed only on the wiring pattern 20 including the metal layer pattern 18a and the barrier layer pattern 16a. A cleaning process may be formed to remove the material adsorbed on the first preliminary insulation layer 12.

In the above process, the first and second oxide layers 22a and 22b may not include the conductive material so that the protection layer pattern 24a may not be formed when the first and second oxide layers 22a and 22b remain on the metal layer pattern 18a and the barrier layer pattern 16a. In some example embodiments, however, the first and second oxide layers 22a and 22b may be sufficiently removed so that the protection layer pattern 24a may be formed to cover the metal layer pattern 18a and the barrier layer pattern 16a.

In some example embodiments, the protection layer pattern 24a may be formed by a CVD process using a cobalt precursor. The cobalt precursor may be selectively deposited on a conductive material so that the protection layer pattern 24a may be only formed on the barrier layer pattern 16a and the metal layer pattern 18a. The cobalt precursor may not be deposited on the first preliminary insulation layer 12 including no conductive material so that the protection layer pattern 24a may not be formed on the first preliminary insulation layer 12.

Then, processes substantially the same as or similar to those illustrated with reference to FIGS. 9 to 10 may be performed to form the wiring structure in FIG. 1.

Figure 11:
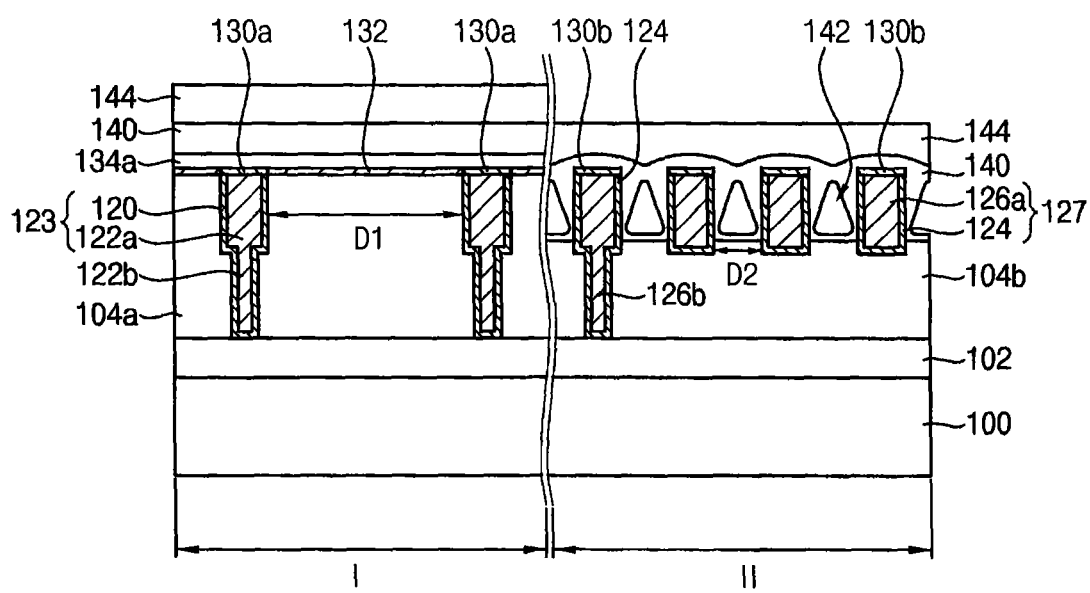

FIG. 11 is a cross-sectional view illustrating a wiring structure in accordance with some example embodiments.

Referring to FIG. 11, a substrate 100 may have a first region I and a second region II. The substrate 100 may be, e.g., a semiconductor substrate. Lower devices (not shown) may be formed on the substrate 100. The lower devices may include a MOS transistor, a diode, and/or wires connected thereto. A lower insulating interlayer 102 may cover the lower devices on the substrate 100.

A first dielectric layer pattern 104a may be formed on the lower insulating interlayer 102 in the first region I. The first dielectric layer pattern 104a may include a material having a dielectric constant lower than that of silicon oxide which may be about 4.0. For example, the dielectric constant of the first dielectric layer pattern 104a may be lower than about 3.5. As the semiconductor devices are highly integrated, a distance between wires has been reduced so that an insulation material having a low dielectric constant may be used. For example, a material having a dielectric constant of about 2.5 may be used for a semiconductor device having a size of less than about 28 nm.

The first dielectric layer pattern 104a may include, e.g., SiCHO or SiOC.

The first dielectric layer pattern 104a may have a first opening (not shown) including a first trench (not shown) and a first contact hole (not shown) that may be in fluid communication with the first trench and expose a top surface of the lower insulating interlayer 102. In some example embodiments, a plurality of first trenches and a plurality of first contact holes may be formed in the first dielectric layer pattern 104a, and the plurality of first trenches may be spaced apart from each other by a first distance D1 in a second direction substantially parallel to the top surface of the substrate 100.

A first barrier layer pattern 120 may be conformally formed on a sidewall and the exposed top surface of the lower insulating interlayer 102. A first metal layer may be formed on the barrier layer pattern 120 in the first opening. Hereinafter, a portion of the first metal layer in the first trench may be referred as a first metal layer pattern 122a, and a portion of the first metal layer in the first contact hole may be referred as a first contact plug 122b. The first metal layer pattern 122a may have a linear shape extending in a first direction substantially parallel to the top surface of the substrate 100 and substantially perpendicular to the second direction. The barrier layer pattern 120 may cover a sidewall and a bottom surface of the first contact plug 122b and a sidewall and a bottom surface of the first metal layer pattern 122a.

Hereinafter, a conductive structure including the first metal layer pattern 122a and the first barrier layer pattern 120 may be referred as a first wiring pattern 123. In some example embodiments, a plurality of first wiring patterns 123 may be spaced apart from each other by the first distance D1 in the second direction. The first dielectric layer pattern 104a may be disposed between the first wiring patterns 123 and between the first contact plugs 122b.

A second dielectric layer pattern 104b may be formed on the lower insulating interlayer 102 in the second region II. A portion of a second barrier layer pattern 124 and a second contact plug 126b may be formed through the second dielectric layer pattern 104b. In some example embodiments, a plurality of second barrier layer patterns 124 and a plurality of second contact plugs 126b may be formed in the second dielectric layer pattern 104b. The second dielectric layer pattern 104b may include a material substantially the same as that of the first dielectric layer pattern 104a. Thus, a material having a low dielectric constant may be formed between the second contact plugs 126b. A top surface of the second contact plug 126b may be substantially coplanar with that of the first contact plug 122b and/or the first metal layer pattern 122a. A portion of the second barrier layer pattern 124 may be formed in an insulation layer 140 on the second dielectric layer pattern 104b. A second metal layer pattern 126a may be formed on the second contact plug 126b, or may be formed on the second dielectric layer pattern 104b. The second metal layer pattern 126a may have a linear shape extending in the first direction. The second barrier layer pattern 124 may cover a sidewall and a bottom surface of the second contact plug 126b and a sidewall and a bottom surface of the second metal layer pattern 126a.

Hereinafter, a conductive structure including the second metal layer pattern 126a and the second barrier layer pattern 124 may be referred as a second wiring pattern 127. In some example embodiments, a plurality of second wiring patterns 127 may be spaced apart from each other by a second distance D2 in the second direction. The second distance D2 may be smaller than the first distance D1. Materials in the first and second barrier layer patterns 120 and 124 may be substantially same as each other. The first and second metal layer patterns 122a and 126a may include materials substantially the same as those in the first and second contact plugs 122b and 126b, respectively. The first and second barrier layer patterns 120 and 124 may include, e.g., tantalum, titanium, tungsten, etc. In some example embodiments, each of the first and second barrier layer patterns 120 and 124 may include a tantalum nitride layer and a tantalum layer sequentially stacked. The first and second metal layer patterns 122a and 126a may include, e.g., copper.

A first protection layer pattern 130a may cover top surfaces of the first barrier layer pattern 120 and the first metal layer pattern 122a. A second protection layer pattern 130b may cover top surfaces of the second barrier layer pattern 124 and the second metal layer pattern 126a. A sacrificial layer pattern 132 may be formed on the first dielectric layer pattern 104a.

The first and second protection layer patterns 130a and 130b may include materials substantially the same as each other, e.g., a metal or a metal nitride. The materials in the first and second protection layer patterns 130a and 130b may not include oxygen. In some example embodiments, the first and second protection layer patterns 130a and 130b may include aluminum nitride.

The first dielectric layer pattern 104a may be formed between the first wiring patterns 123 spaced apart from each other by the first distance D1, which may be greater than the second distance D2 between the second wiring patterns 127.

A third dielectric layer pattern 134a may be formed on the first protection layer pattern 130a and the sacrificial layer pattern 132 in the first region I. The third dielectric layer pattern 134a may not be formed in the second region II. The third dielectric layer pattern 134a may include a material having a low dielectric constant, e.g., SiCN.

The insulation layer 140 may be formed on the third dielectric layer pattern 134a in the first region I, and the insulation layer 140 may cover a top surface of the second protection layer pattern 130b in the second region II. The insulation layer 140 may define at least an upper surface of an air gap 142 between the plurality of second wiring patterns 127. The insulation layer 140 may be formed on sidewalls of the second wiring patterns 127 and a top surface of the second dielectric layer pattern 104b, and in this case, the second dielectric layer pattern 104b may define a lower surface of the air gap 28 as well.

The insulation layer 140 may include an insulation material having poor step coverage characteristics. The insulation layer 140 may include a material having a dielectric constant lower than that of silicon oxide and a good elasticity, e.g., SiCN.

In some example embodiments, a plurality of air gaps 142 may be formed in the insulation layer 140 between the second wiring patterns 127. The air gaps 142 may be formed only between the second wiring patterns 127 spaced apart from each other by the second distance D2, and thus the semiconductor device may have more stable structure when compared to a conventional semiconductor device having air gaps in the entire insulation layer. The semiconductor device may have a good reliability and good mechanical stability so that defects may not be generated during processes for forming the semiconductor device including wiring structure.

As illustrated above, the second protection layer pattern 130b may be formed on the second wiring pattern 127 so that the second metal layer pattern 126a may not be corroded in an etching process for forming the air gap 142 because of the second protection layer pattern 130b. Therefore, the second wiring pattern 127 may have a low resistance.

FIGS. 12 to 17 are cross-sectional views illustrating stages of methods of forming a wiring structure in accordance with some example embodiments.

Figure 12:
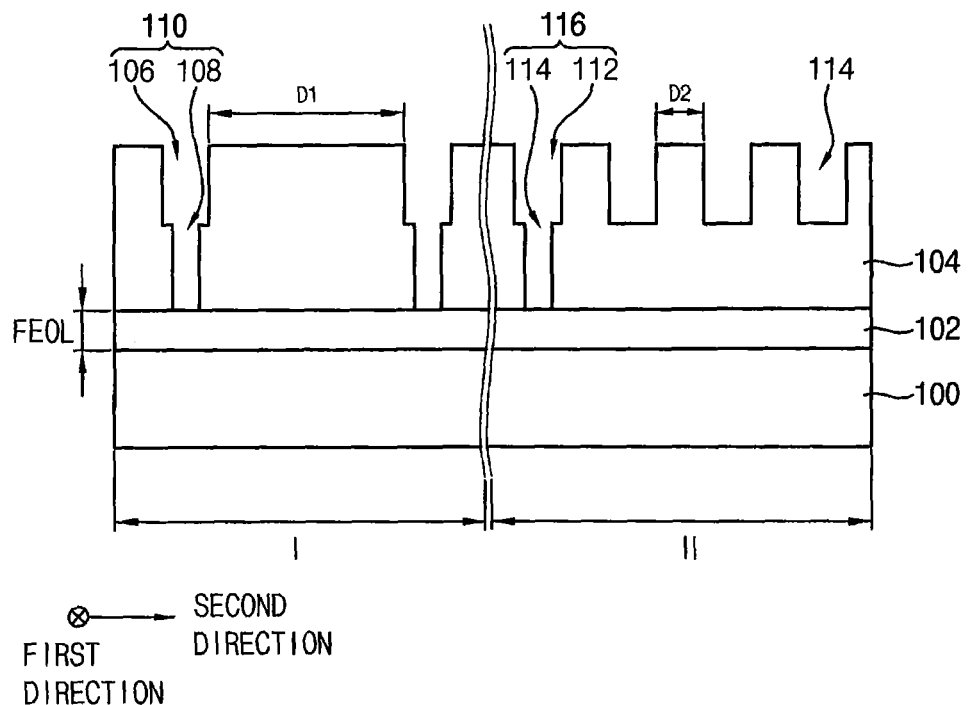

Referring to FIG. 12, a substrate 100 may have a first region I and a second region II. The substrate 100 may be a semiconductor substrate. Lower devices (not shown) may be formed on the substrate 100 by a FEOL process, and a lower insulating interlayer 102 may be formed thereon.

A first dielectric layer 104 may be formed on the lower insulating interlayer 102. The first dielectric layer 104 may include a material having a dielectric constant lower than that of silicon oxide which may be about 4.0. In some example embodiments, the first dielectric layer 104 may be formed by a CVD process and/or a PECVD process using, e.g., SiCHO or SiOC.

A portion of the first dielectric layer 104 in the first region I may be etched to form a plurality of first openings 110, and each first opening 110 may be formed to include a first contact hole 108 and a first trench 106.

A portion of the first dielectric layer 104 in the second region II may be etched to form a plurality of second openings 116 exposing top surfaces of the lower insulating interlayer 102, and each second opening 116 may be formed to include a second contact hole 114 and a second trench 112. The first contact hole 108 may be formed to be in fluid communication with a lower portion of the first trench 106, and the second contact hole 114 may be formed to be in fluid communication with a lower portion of the second trench 112. The first trench 106 may serve as a mold layer for forming a first wiring pattern 123 in a subsequent process (refer to FIG. 13), and the second trench 112 may serve as a mold layer for forming a second wiring pattern 127 in a subsequent process (refer to FIG. 13).

The first and second contact holes 108 and 114 may be formed beneath some of the first and second trenches 106 and 112. In some example embodiments, a plurality of first trenches 106 may be formed to be spaced apart from each other by a first distance D1, and a plurality of second trenches 112 may be formed to be spaced apart from each other by a second distance D2, which may be smaller than the first distance D1.

Figure 13:
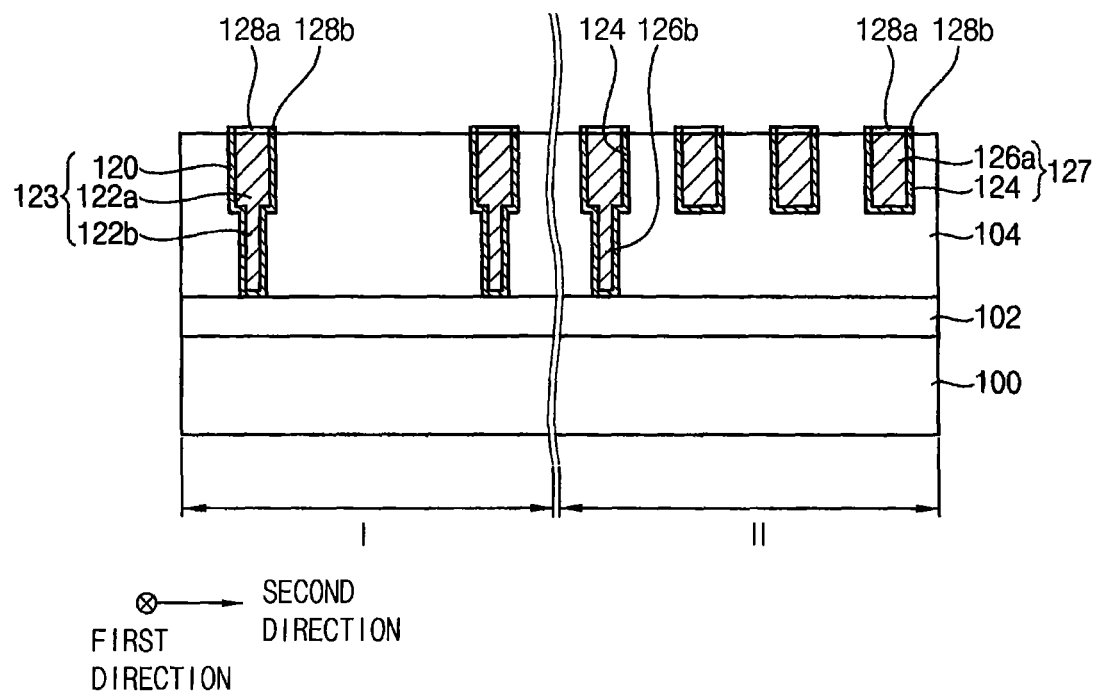

Referring to FIG. 13, a process substantially identical or similar to the process illustrated with reference to FIG. 3 may be performed so that a barrier layer may be conformally formed on inner walls of the first and second openings 110 and 116, the exposed top surfaces of the lower insulating interlayer 104 and a top surface of the first dielectric layer 104. A metal layer may be over-deposited on the barrier layer so that the metal layer may sufficiently fill the first and second openings 110 and 116. In some example embodiments, the barrier layer may be formed to include, e.g., a tantalum nitride layer and a tantalum layer sequentially stacked. The metal layer 18 may be formed to include, e.g., copper.

The metal layer and the barrier layer may be planarized to expose the top surface of the first dielectric layer 104 by a CMP process. Hereinafter, remaining portions of the metal layer in the first trench 106 and the first contact hole 108 may be referred as a first metal layer pattern 122a and a first contact plug 122b, respectively. A remaining portion of the barrier layer in the first region I may be referred as a first barrier layer pattern 120. Accordingly, remaining portions of the metal layer in the second trench 114 and the second contact hole 116 may be referred as a second metal layer pattern 126a and a second contact plug 126b, respectively. A remaining portion of the barrier layer in the second region II may be referred as a second barrier layer pattern 124. Hereinafter, a first conductive structure including the first metal layer pattern 122a and the first barrier layer pattern 120 may be referred as a first wiring pattern 123, and a second conductive structure including the second metal layer pattern 126a and the second barrier layer pattern 124 may be referred as a second wiring pattern 127.

Exposed portions of the first and second wiring patterns 123 and 127 may be naturally oxidized so that a first oxide layer 128a may be formed on top surfaces of the first and second metal layer patterns 122a and 126a, and a second oxide layer 128b may be formed on top surfaces of the first and second barrier layer patterns 120 and 124. In some example embodiments, the first oxide layer 128a may include $CuO_x$, and the second oxide layer 128b may include $TaO_x$.

Figure 14:
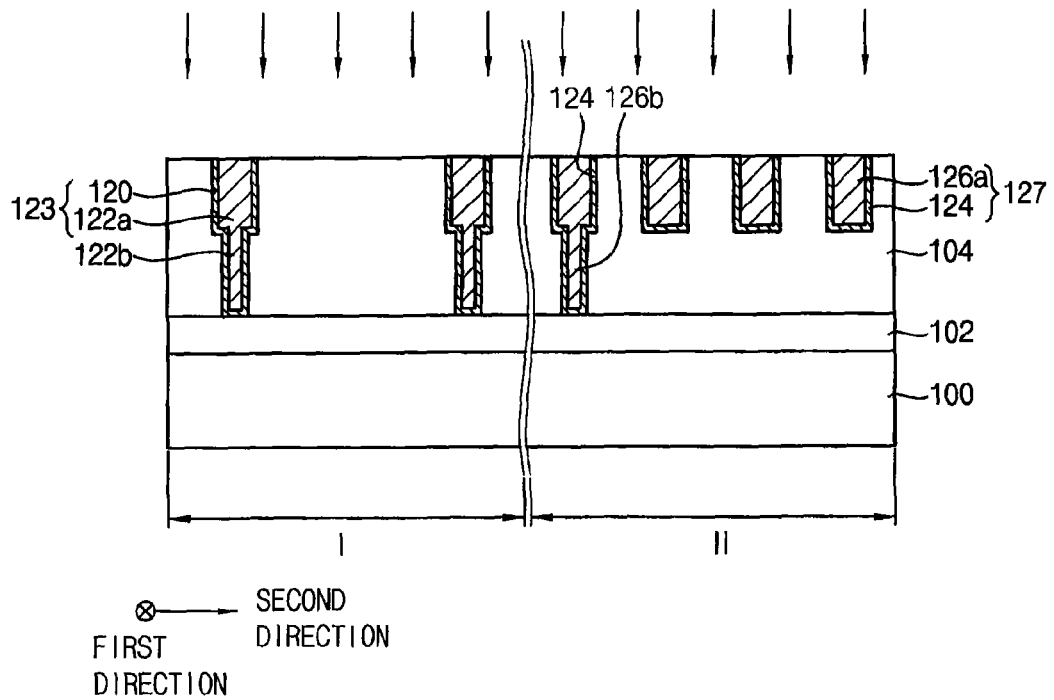

Referring to FIG. 14, processes substantially identical or similar to those illustrated with reference to FIGS. 5 and 6 may be performed so that the first and second oxide layers 128a and 128b may be sufficiently removed from the first and second wiring patterns 123 and 127.

A UV pre-treatment process may be performed so that UV may be radiated onto the first and second wiring patterns 123 and 127 in a vacuum chamber (not shown). In the UV pre-treatment process, a reducing gas including, e.g., ammonia gas and/or hydrogen gas may be injected into the vacuum chamber in order to remove the first and second oxide layers 128a and 128b.

An ammonia plasma treatment process may be performed in a vacuum chamber (not shown) different from that of the UV pre-treatment process in order to sufficiently remove the first and second oxide layers 128a and 128b.

Figure 15:
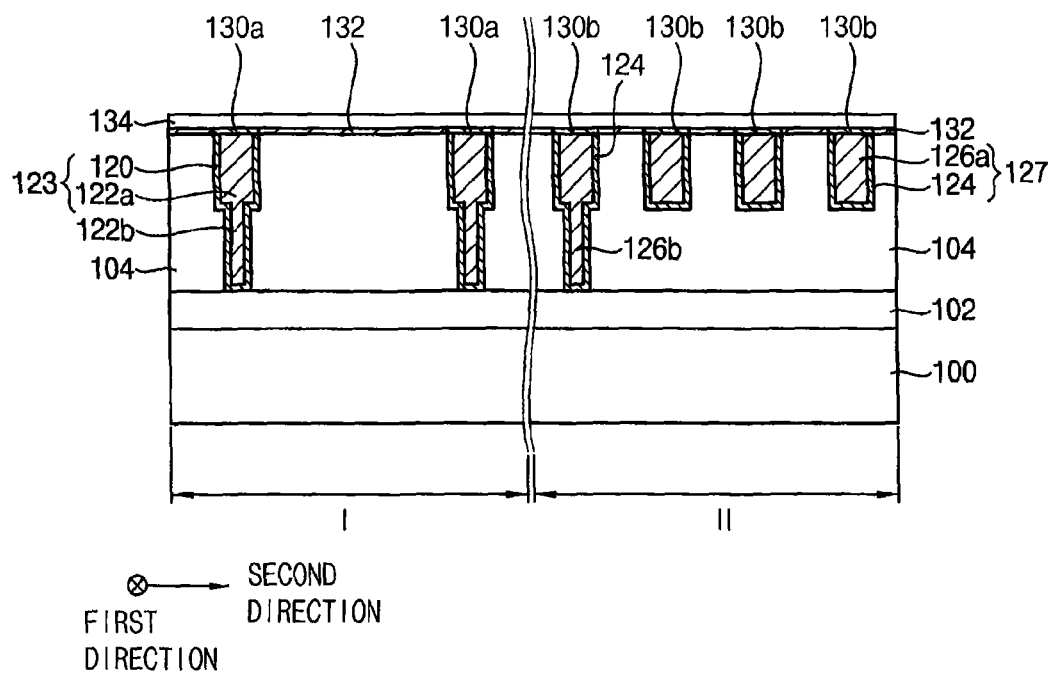

Referring to FIG. 15, first and second protection layer patterns 130a and 130b may be formed on the first and second wiring patterns 123 and 127, respectively, by a deposition process in a vacuum chamber (not shown). A sacrificial layer pattern 132 may be formed on the first dielectric layer pattern 104 by the deposition processes. The first protection layer pattern 130a may be formed to include a material substantially the same as that of the second protection layer pattern 130b.

The deposition process may be performed using a material having a high reactivity with respect to oxygen so as to form a layer having materials different from each other according to a material included in an underlying layer. For example, the material may be formed to include, e.g., a metal nitride. The first and second protection layer patterns 130a and 130b may be formed to include a metal nitride because the first and second wiring patterns 123 and 127 may be formed to include no oxygen. The first sacrificial layer pattern 132 may be formed to include a metal oxynitride because the first dielectric layer pattern 104 may be formed to include oxygen. In some example embodiments, the first and second protection layer patterns 130a and 130b may be formed to include aluminum nitride, and the sacrificial layer pattern 132 may be formed to include aluminum oxynitride.

A third dielectric layer 134 may be formed on the first and second protection layer patterns 130a and 130b and the sacrificial layer pattern 132. The third dielectric layer 134 may be formed to include a material having a dielectric constant lower than that of silicon oxide, e.g., SiCN.

Figure 16:
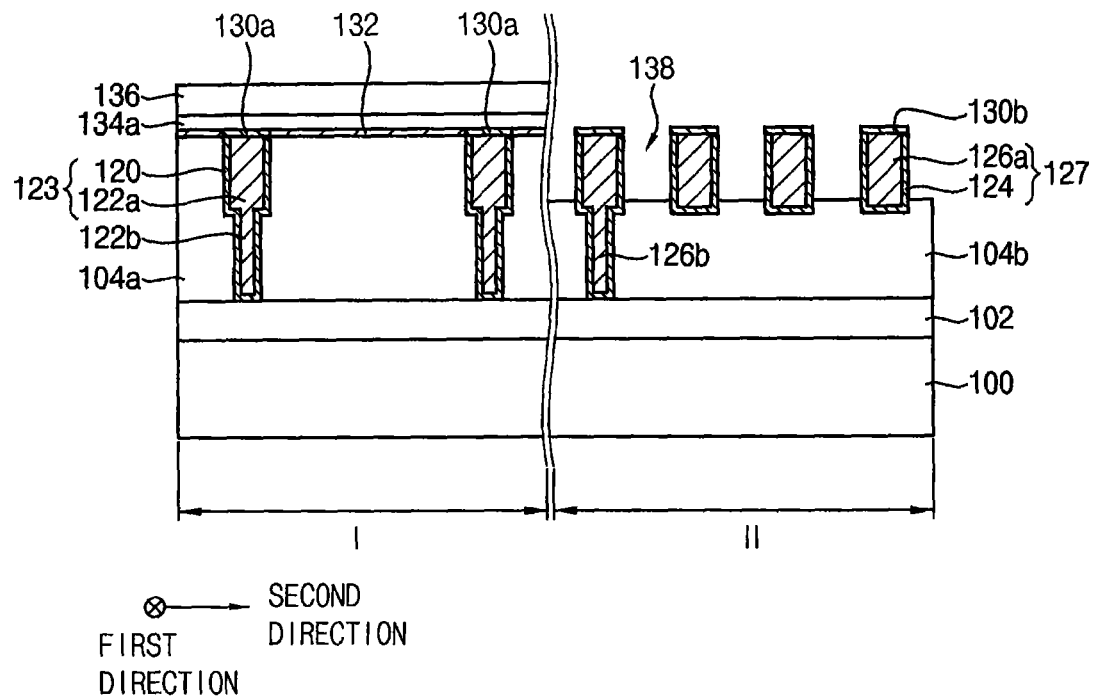

Referring to FIG. 16, a mask 136 may be formed to cover a portion of the third dielectric layer 134 in the first region I and expose a portion of the third dielectric layer 134 in the second region II. The mask 136 may be formed to include a photoresist pattern.

A portion of the third dielectric layer 134 not covered by the mask 136 in the second region II and a portion of the sacrificial layer pattern 132 thereunder may be removed using the mask 136 as an etching mask. Hereinafter, a remaining portion of the third dielectric layer 134 in the first region I may be referred to as a third dielectric layer pattern 134a. The second protection layer pattern 130b may not be removed during the etching process. Then, upper portions of the first dielectric layer 104 between the second wiring patterns 127 may be etched to form a plurality of recesses 138. Hereinafter, remaining portions of the first dielectric layer 104 in the first and second regions I and II may be referred as a first dielectric layer pattern 104a and a second dielectric layer pattern 104b, respectively. A top surface of the second dielectric layer pattern 104b may be formed to be lower than that of the first dielectric layer pattern 104a. Each recess 138 may be formed to have a bottom surface between half of a height of the second wiring pattern 127 and a lower surface of the second wiring pattern 127. In the etching process, a portion of the first dielectric layer 104 adjacent a bottom surface of the second metal layer pattern 126a may be removed.

However, portions of the first protection layer pattern 130a and the sacrificial layer pattern 132 in the first region I may remain after the etching process because of the mask 136.

The etching process may include a wet etching process. In some example embodiments, the third dielectric layer 134, the sacrificial layer pattern 132 and the first dielectric layer 104 in the second region II may be removed using a diluted HF as an etching solution.

Then, the mask 136 may be removed.

Figure 17:
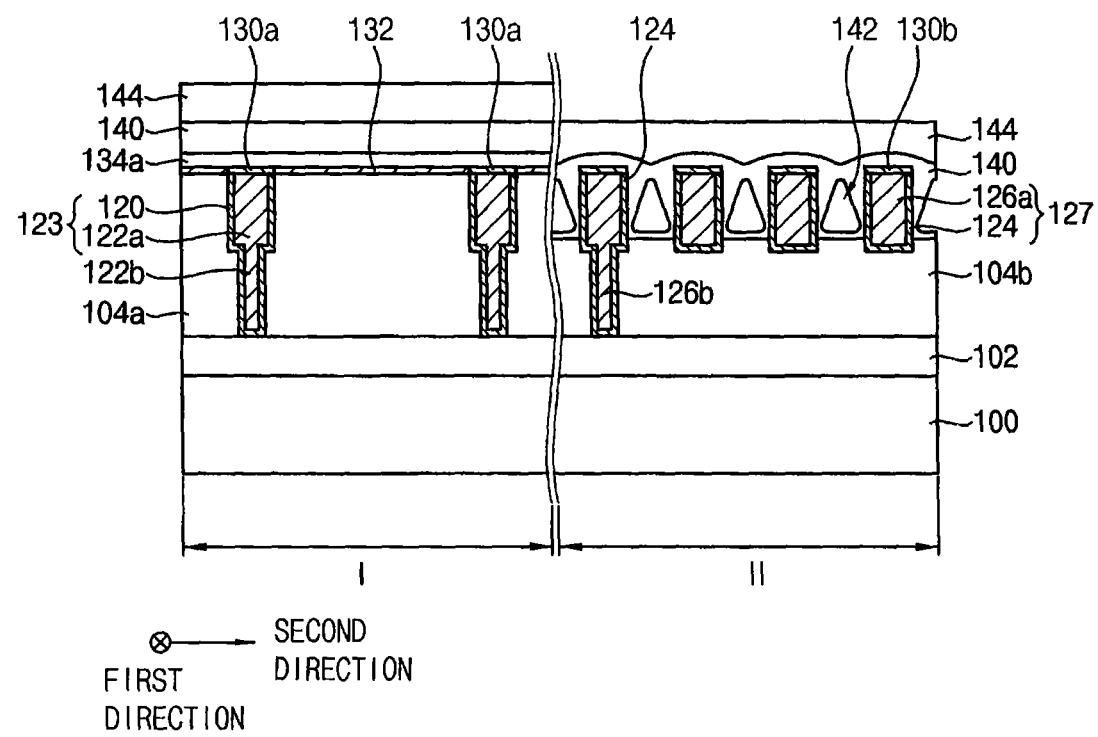

Referring to FIG. 17, a process substantially identical or similar to the process illustrated with reference to FIG. 10 may be performed so that an insulation layer 140 may be formed to include an air gap 142 between the second wiring patterns 127 on the third dielectric layer pattern 134a, the second dielectric layer pattern 104b and the protection layer pattern 130b. In some example embodiments, a plurality of air gaps 142 may be formed to be spaced apart from each other between the second wiring patterns 127.

An upper insulating interlayer 144 may be further formed on the insulation layer 140.

The air gap 142 may be formed between the second wiring patterns 127 so that a parasitic capacitance therebetween may be reduced. The first dielectric layer pattern 104a may be formed between the first wiring patterns 123 spaced apart from each other by the first distance D1 greater than the second distance D2 between the second wiring patterns 127, which may include a material having a low dielectric constant.

Figure 18:
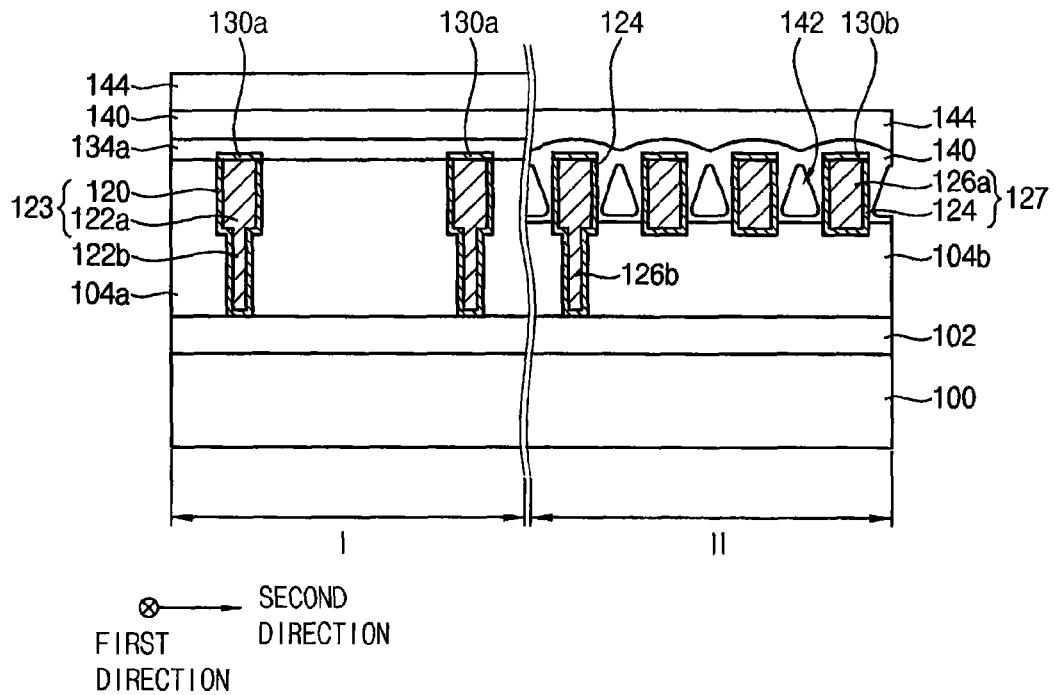

FIG. 18 is a cross-sectional view illustrating a wiring structure in accordance with some example embodiments.

The wiring structure in FIG. 18 may be substantially same as or similar to that in FIG. 11 except for a sacrificial layer pattern. No sacrificial layer pattern may be formed in a first region I unlike the wiring structure of FIG. 11.

Referring to FIG. 18, a first protection layer pattern 130a may cover a top surface a first wiring pattern 123 including a first barrier layer pattern 120 and a first metal layer pattern 122a. A second protection layer pattern 130b may cover a top surface of a second wiring pattern 127 including a second barrier layer pattern 124 and a second metal layer pattern 126a. However, no sacrificial layer pattern may be formed on a first dielectric layer pattern 104a in the first region I.

The first protection layer pattern 130a may include a material substantially same as that of the second protection layer pattern 130b. The material may have a high reactivity with respect to oxygen so as to form a layer having materials different from each other according to a material included in an underlying layer. The first and second protection layer patterns 130a and 130b may include cobalt, e.g., CO, $COSi_2$, COWP, COPRu, etc.

A third dielectric layer pattern 134a may be formed on the first dielectric layer pattern 104a and the first protection layer pattern 130a in the first region I. The third dielectric layer pattern 134a may not be formed in the second region II.

Figure 19:
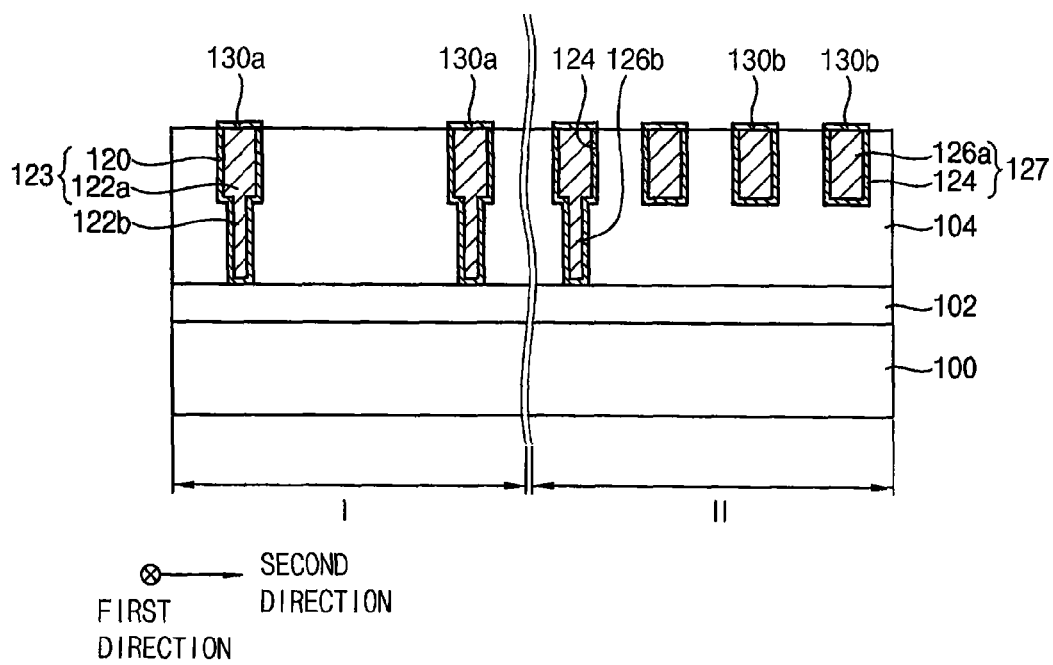
Figure 20:
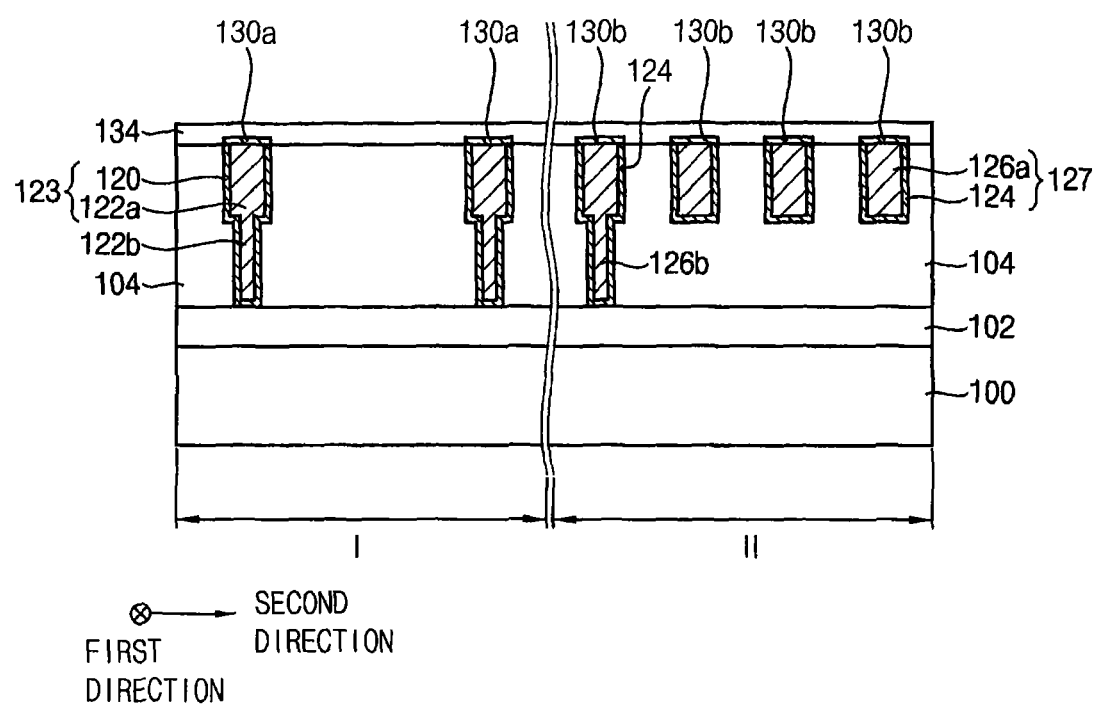

FIGS. 19 and 20 are cross-sectional views illustrating stages of method of forming a wiring structure in accordance with some example embodiments.

Processes substantially the same as or similar to those illustrated with reference to FIGS. 12 to 14 may be performed to form a first wiring pattern 123 and a second wiring pattern 127 in FIG. 14.

Referring to FIG. 19, a first protection layer pattern 130a may be formed on the first wiring pattern 123, and a second protection layer pattern 130b may be formed on the second wiring pattern 127. However, no sacrificial layer pattern may be formed on the first dielectric layer 104.

In some example embodiments, the first and second protection layer patterns 130a and 130b may be formed by, e.g., an electroless plating process using a material containing cobalt, e.g., Co, $CoSi_2$, CoWP, CoPRu, etc.

Referring to FIG. 20, a third dielectric layer 134 may be formed on the first and second protection layer patterns 130a and 130b. The third dielectric layer 134 may include a material having a dielectric constant lower than that of silicon oxide, which may include, e.g., SiCN.

Then, processes substantially the same as or similar to those illustrated with reference to FIGS. 16 to 17 may be performed to form the wiring structure in FIG. 18.

Figure 21A:
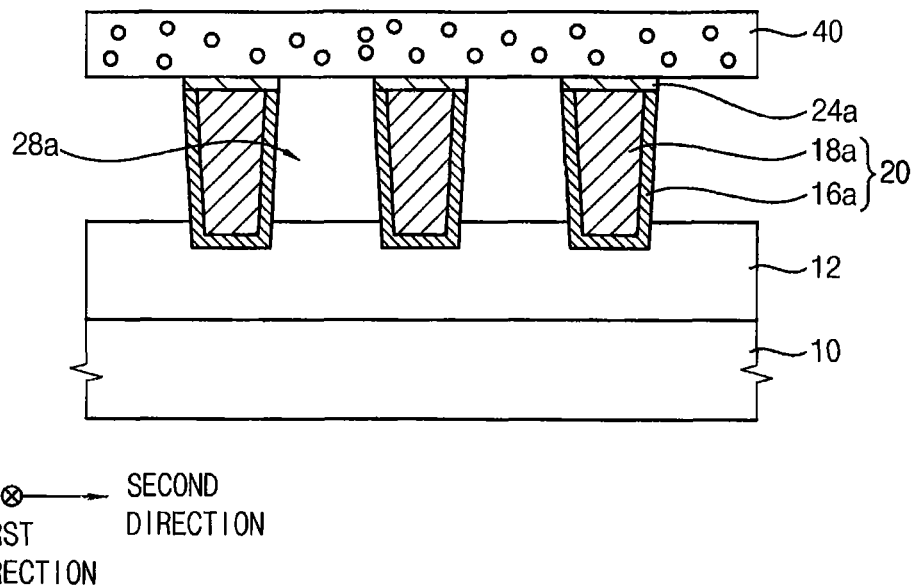
FIG. 21A is a cross-sectional view illustrating a wiring structure in accordance with some example embodiments.
Figure 21B:
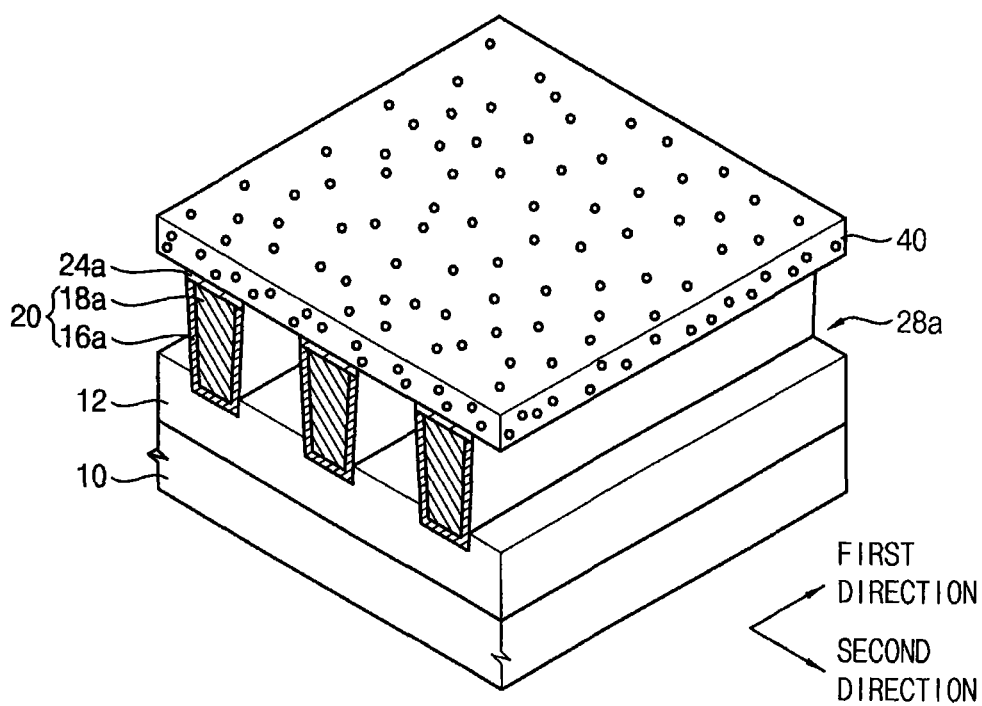
FIG. 21B is a perspective view of the wiring structure in FIG. 21A.

FIG. 21A is a cross-sectional view illustrating a wiring structure in accordance with some example embodiments, and FIG. 21B is a prospective view of the wiring structure in FIG. 21A.

The wiring structure in FIGS. 21A and 21B may be substantially the same as or similar to that in FIGS. 1A and 1B except for an insulation material on a sidewall of a wiring pattern.

Referring to FIGS. 21A and 21B, a first insulation layer 12 may be formed on a substrate 10. A plurality of wiring patterns 20 may be formed on the first insulation layer 12, and each of the wiring patterns 20 may include a barrier layer pattern 16a and a metal layer pattern 18a. A protection layer pattern 24a may be formed on the wiring pattern 20.

The first insulation layer 12, the wiring pattern 20 and the protection layer pattern 24a may be substantially the same as those in FIGS. 1A and 1B.

A second insulation layer 40 may cover a top surface of the protection layer pattern 24a, and may define an upper surface of an air gap 28a between the plurality of wiring patterns 20. The second insulation layer 40 may include a permeable material. The second insulation layer 40 may not be formed on sidewalls of the wiring patterns 20 and a top surface of the first insulation layer 12. The air gap 28a may be defined by the second insulation layer 40, sidewalls of the wiring patterns 20 and the top surface of the first insulation layer 12.

Figure 22:
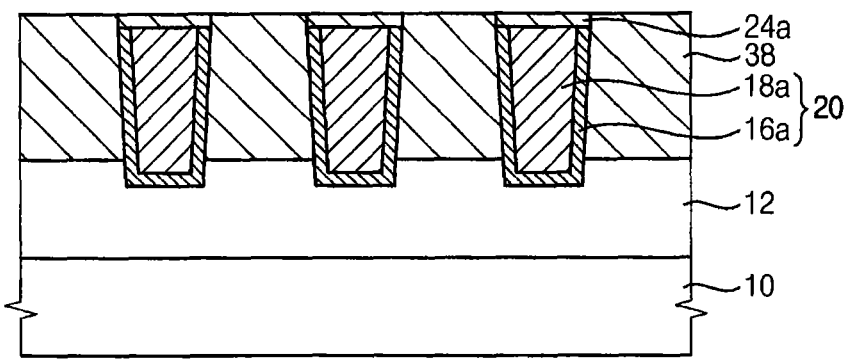
Figure 23:
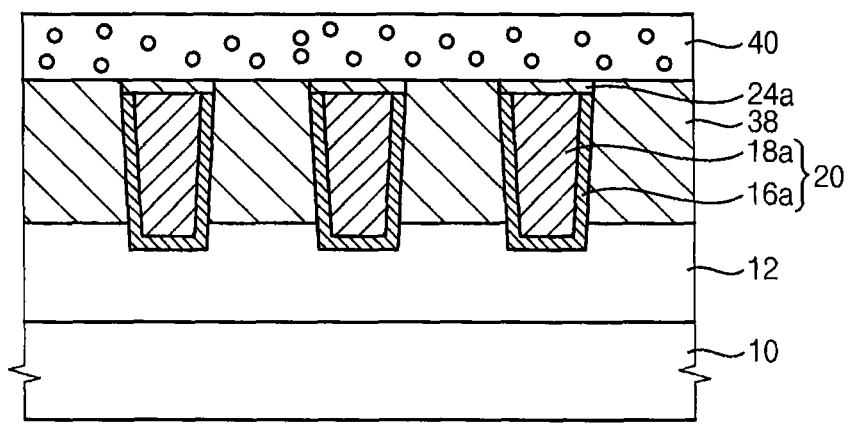
Figure 24:
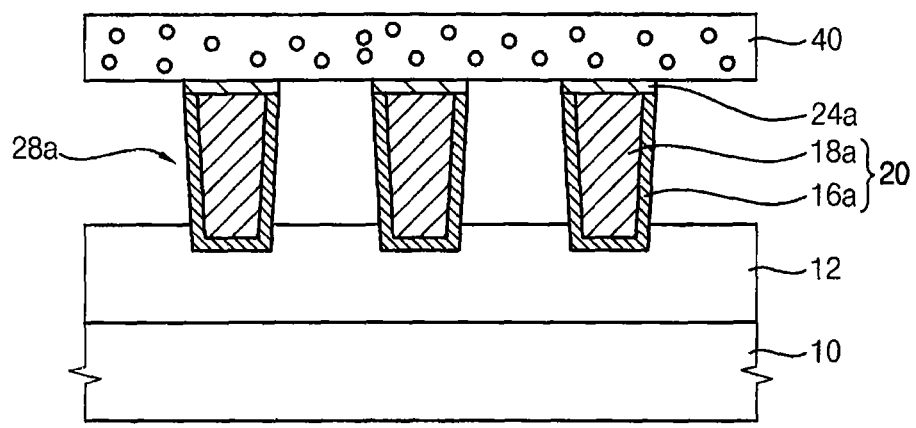

FIGS. 22 to 24 are cross-sectional views illustrating stages of methods of forming a wiring structure in accordance with some example embodiments.

Processes substantially the same as or similar to those illustrated with reference to FIGS. 2 to 9 may be performed to form a first insulation layer 12a in FIG. 9.

Referring to FIG. 22, a sacrificial layer may be formed to sufficiently fill the plurality of recesses 25 between the plurality of wiring patterns 20. The sacrificial layer may be formed to include a porous material having C—H bond. The porous material may be easily removed by an ashing process using oxygen gas and/or ozone gas.

The sacrificial layer may be planarized until a top surface of a protection layer pattern 24a is exposed to form a sacrificial layer pattern 38 by a CMP process and/or an etch back process. The sacrificial layer pattern 38 may be disposed between the wiring patterns 20.

Referring to FIG. 23, a second insulation layer 40 may be formed on the protection layer pattern 24a and the sacrificial layer pattern 38. The second insulation layer 40 may be formed to include a permeable material. In some example embodiments, the second insulation layer 40 may be formed to include an insulating material containing carbon.

Referring to FIG. 24, the sacrificial layer pattern 38 may be removed to form a plurality of air gaps 28a. An ashing process may be performed onto the sacrificial layer pattern 38 using oxygen gas and/or ozone gas. Carbon in the second insulation layer 40 may be reacted with oxygen in the oxygen gas and/or ozone gas to be removed so that a pore may be formed in the sacrificial layer pattern 38. Gases and/or ions may be injected through the pore into the underlying sacrificial layer pattern 38 so as to remove the sacrificial layer pattern 38 to form the air gaps 28a.

The wiring structure in FIGS. 21A and 21B may be formed by the above process.

Figure 25:
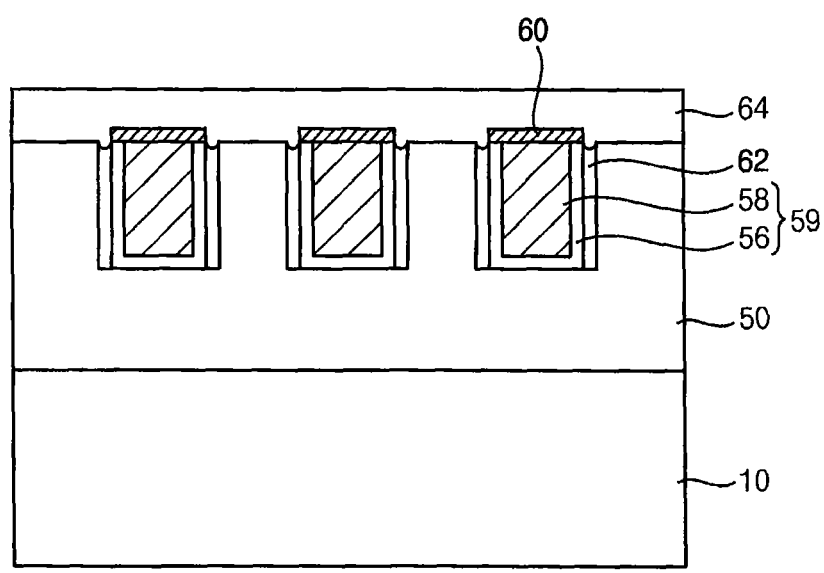

FIG. 25 is a cross-sectional view illustrating a wiring structure in accordance with some example embodiments.

The wiring structure in FIG. 25 may include a plurality of air gaps 62 having a shape of spacer.

Referring to FIG. 25, a first dielectric layer 50 may be formed on a substrate 10. The first dielectric layer 50 may include a material having a dielectric constant lower than that of silicon oxide which may be about 4.0. For example, the dielectric constant of the material in the first dielectric layer 50 may be lower than about 3.5. In some embodiments, the first dielectric layer 50 may include silicon oxide.

The first dielectric layer 50 may include a plurality of trenches (not shown) therein. A wiring pattern 59 may be formed on each trench, which may include a barrier layer pattern 56 and a metal layer pattern 58 sequentially stacked. A protection layer pattern 60 may be formed only on the wiring pattern 59. The protection layer pattern 60 may be substantially the same as that in FIGS. 1A and 1B.

Each of the air gaps 62 may be formed between sidewalls of the trench and the wiring pattern 59. That is, each air gap 62 may be formed near the sidewall of the wiring pattern 59.

An insulation layer 64 may be formed on the first dielectric layer 50 and the protection layer 60, and may define an upper surface of each air gap 62. The sidewalls of the wiring pattern 59 and the trench may define sidewalls of each air gap 62, and a lower surface of the insulation layer 64 may define a top surface of each air gap 62.

FIGS. 26 to 29 are cross-sectional views illustrating stages of methods of forming a wiring structure in accordance with some example embodiments.

Figure 26:
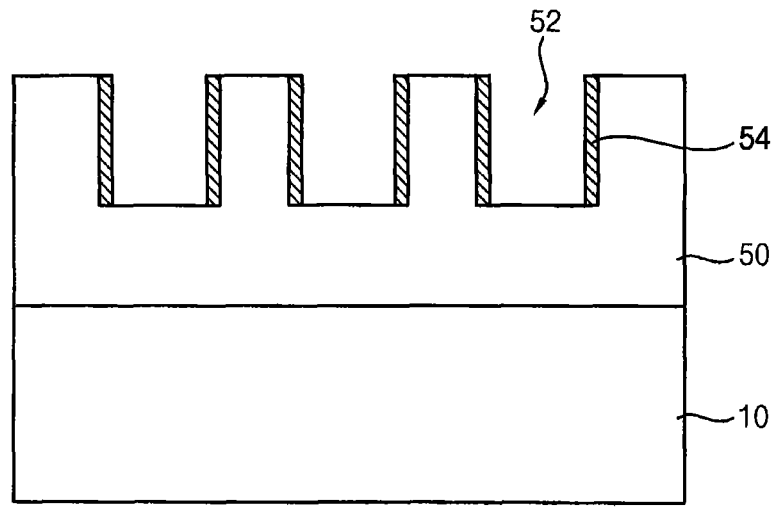

Referring to FIG. 26, a first dielectric layer 50 may be formed on a substrate 10. The dielectric layer 50 may be formed to include a material having a dielectric constant lower than that of silicon oxide, i.e., about 4.0. For example, the dielectric layer 50 may be formed to include, e.g., SiCHO or SiOC.

A portion of the first dielectric layer 50 may be etched to form a plurality of trenches 52. A wiring pattern 59 (refer to FIG. 27) and an air gap 62 (refer to FIG. 28) may be formed in each trench 52 later, and thus a width of each trench 52 may be formed to be wider than that of the wiring pattern 59.

A sacrificial spacer layer may be formed on innerwalls of the trenches 52 and the dielectric layer 50, and may be anisotropically etched to form a sacrificial spacer 54 on sidewalls of the trenches 52. The sacrificial spacer 54 may be formed to include a material having an etching selectivity with respect to the first dielectric layer 50. In some example embodiments, the sacrificial spacer 54 may be formed to include, e.g., silicon nitride. In a subsequent process, the sacrificial spacer 54 may be removed to form the air gap 62, and thus, a width of the sacrificial spacer 54 may be substantially same as that of the air gap 62. Therefore, a width of the sacrificial spacer 54 may be adjusted to determine a width of the air gap 62.

Figure 27:
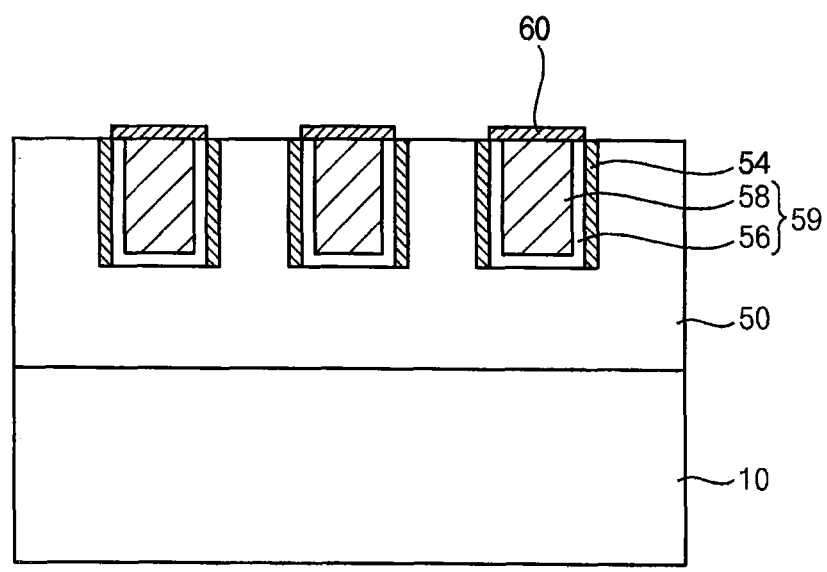

Referring to FIG. 27, processes identical or similar to those illustrated with reference to FIGS. 3 to 8 may be performed so that a wiring pattern 59 may be formed in each trench 52 having the sacrificial spacer 54 on the inner wall thereof, which may be formed to include a barrier layer pattern 56 and a metal layer pattern 58 sequentially stacked. A UV pre-treatment process may be performed to remove an oxide layer naturally formed on the wiring pattern 59 using a reducing gas. An ammonia plasma treatment process may be performed to sufficiently remove the oxide layer on the wiring pattern 59. A protection layer pattern 60 may be formed on the wiring pattern 59.

Figure 28:
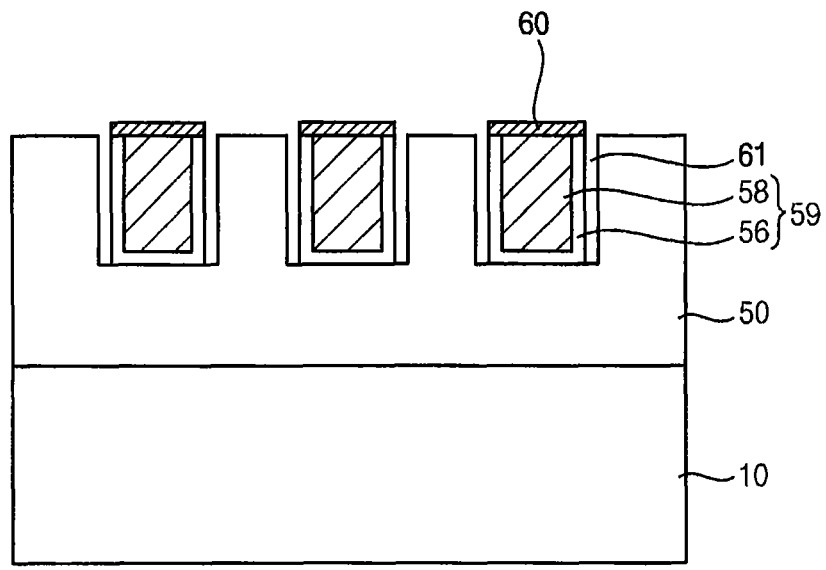
Figure 28:

Referring to FIG. 28, the sacrificial spacer 54 may be selectively removed to form a preliminary air gap 61 adjacent a sidewall of the wiring pattern 59 by a wet etching process. For example, the wet etching process may be performed using a diluted HF solution as an etching solution.

The protection layer 60 on the wiring pattern 59 may prevent the metal layer pattern 58 from being damaged in the etch process.

Figure 29:
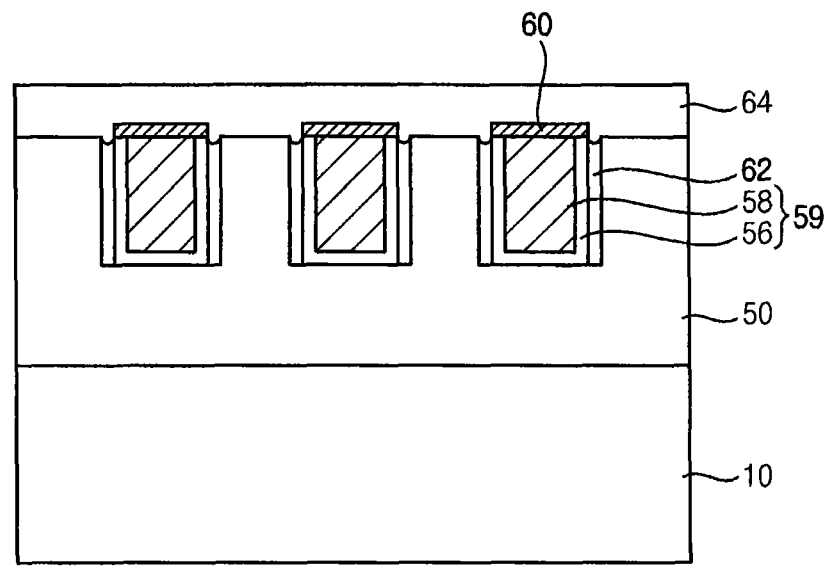
Figure 29:

Referring to FIG. 29, an insulation layer 64 may be formed on the first dielectric layer 50 and the protection layer pattern 60, and the air gap 62 may be formed.

The wiring structure 50 in FIG. 25 may be formed by the above process.

Experiment 1

Example 1

A tantalum layer serving as a barrier layer pattern was formed on a substrate. Then, a UV pre-treatment process was performed on the tantalum layer using hydrogen gas and ammonia gas. An ammonia plasma treatment process was performed thereon, and then, aluminum nitride layer serving as a protection layer pattern was formed on the tantalum layer.

Comparative Example 1

A tantalum layer serving as a barrier layer pattern was formed on a substrate. Then, an ammonia plasma treatment process was performed thereon, and then, aluminum nitride layer serving as a protection layer pattern was formed on the tantalum layer. That is, a UV pre-treatment process was not performed on the tantalum layer.

Figure 30:
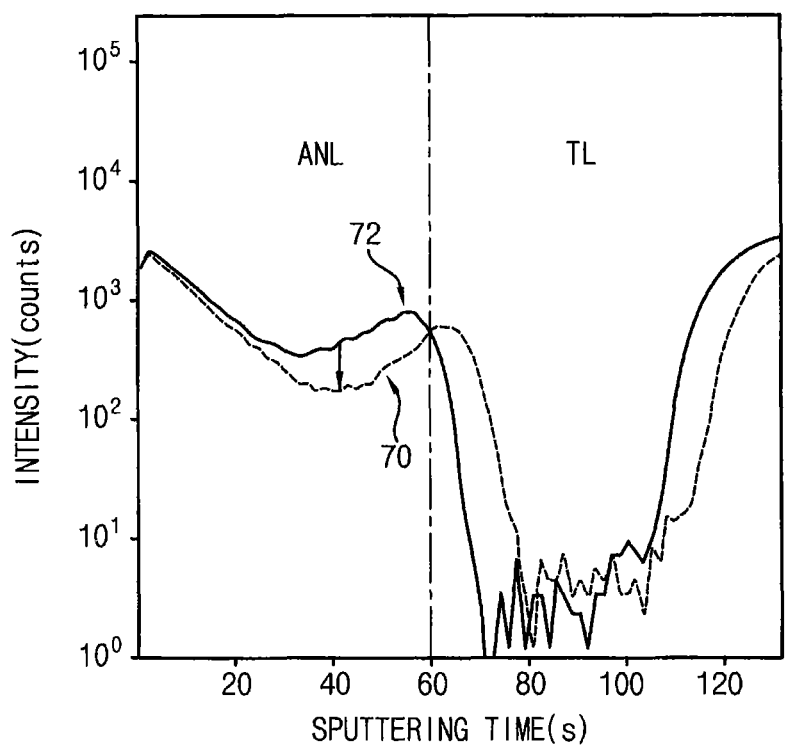

FIG. 30 is a graph illustrating contents of oxygen in tantalum layers and aluminum nitride layers in Example 1 and Comparative Example 1.

In FIG. 30, a reference numeral 70 represents oxygen contents in a tantalum layer (TL) and an aluminum nitride layer (ANL) of Example 1, and a reference numeral 72 represents oxygen contents in a tantalum layer (TL) and an aluminum nitride layer (ANL) of Comparative Example 1.

Referring to FIG. 30, the oxygen content of Example 1 is considerably less than that of Comparative Example 1 at an interface between the aluminum nitride layer (ANL) and the tantalum layer (TL). In addition, the oxygen content in the aluminum nitride layer (ANL) of Example 1 is considerably less than that of Comparative Example 1 in the aluminum nitride layer (ANL).

The graph illustrates that the aluminum nitride layer was formed to include a very small amount of oxide therein. Thus, the graph illustrates that an oxide layer naturally formed on the barrier layer was removed by the UV pre-treatment process.

Experiment 2

Example 2

An insulation layer was formed on a substrate. A plurality of openings including a plurality of via contact holes and a plurality of trenches was formed.

Processes identical or similar to those illustrated with reference to FIGS. 3 to 10 were performed. A barrier layer pattern was formed to include a tantalum nitride layer and a tantalum layer, and a metal layer pattern was formed to include copper. A protection layer pattern was formed to include aluminum nitride. A UV pre-treatment process was performed using hydrogen gas and ammonia gas, and an ammonia plasma treatment process was performed thereon prior to forming the protection layer pattern. Thus, a via chain pattern structure which includes a via contact and a wiring structure having the metal layer pattern and the barrier layer pattern was formed on the insulation layer. A plurality of air gaps was formed between the wiring structures.

Comparative Example 2

Processes identical or similar to those for forming the wiring structure of Example 2 were performed. However, a UV pre-treatment process was not performed prior to forming a protection layer pattern, and only an ammonia plasma treatment process was performed.

Figure 31:
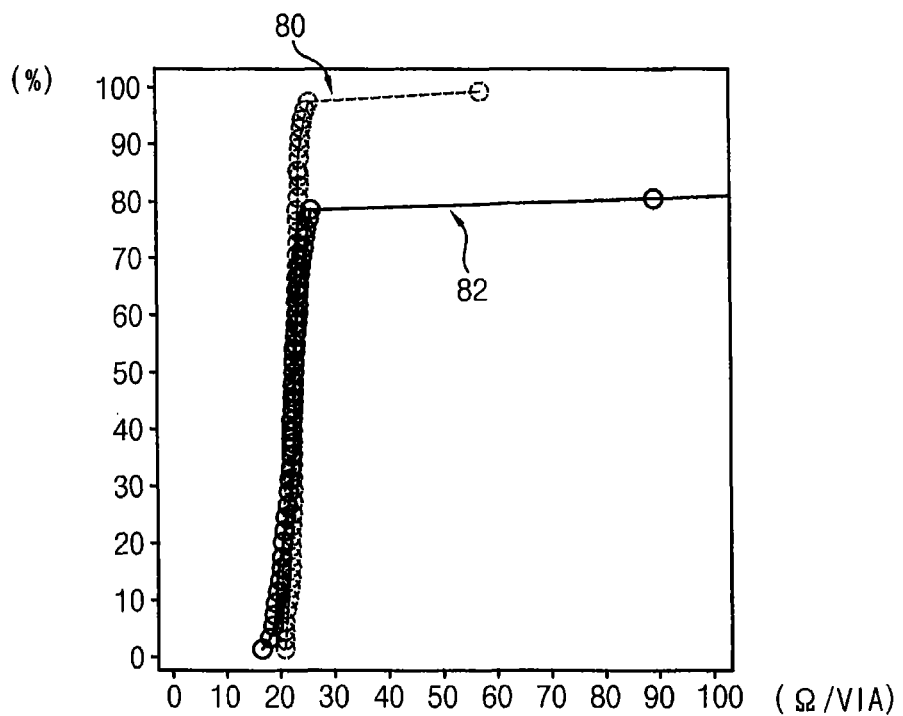

FIG. 31 is a graph illustrating yields of wiring structures in Example 2 and Comparative Example 2.

In FIG. 31, a reference numeral 80 represents yields of a via chain pattern structure according to a resistance of the via contact in Example 2, and a reference numeral 82 represents yields of a via chain pattern structure according to a resistance of the via contact in Comparative Example 2.

Referring to FIG. 31, the via chain pattern structure in Example 2 has the yields of about 99% when the resistance of the via contact equal to or less than about 30Ω is considered as a standard. On the other hand, the via chain pattern structure in Comparative Example 2 has a yield of about 80% when the resistance of the via contact equal to or less than about 30Ω is considered as a standard.

That is, a yield of the via chain pattern structure was increased to about 19% when a UV pre-treatment process was performed prior to forming a protection layer pattern. The wiring pattern was prevented from being corroded because of the UV pre-treatment process, and thus, a yield of the wiring pattern was increased.

An oxide naturally formed on a barrier layer pattern and a metal layer pattern may be sufficiently removed by the UV pre-treatment process prior to forming the protection layer pattern so that the wiring structure may have a low resistance.

The present invention concepts may be used in various wiring structures in semiconductor devices. The wiring structures may be used in highly integrated semiconductor devices.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a wiring structure, the method comprising:
   forming, on a substrate, a first insulation layer that includes a plurality of trenches therein;
   forming a barrier layer in the plurality of trenches and on an upper surface of the first insulation layer;
   forming a metal layer on the barrier layer to fill the plurality of trenches;
   planarizing upper portions of the metal layer and the barrier layer until the upper surface of the first insulation layer is exposed to form a metal layer pattern having a first oxide layer thereon and a barrier layer pattern having a second oxide layer thereon;
   performing an ultraviolet (UV) pre-treatment process using UV and a reducing gas on the metal layer pattern and the barrier layer pattern to remove the first and second oxide layers thereon, respectively, so as to form a plurality of wiring patterns, wherein the plurality of wiring patterns include the barrier layer pattern and the metal layer pattern;
   forming a protection layer pattern directly on top surfaces of the plurality of wiring patterns, the protection layer pattern including a material having a high reactivity with respect to oxygen;
   partially removing the first insulation layer to form recesses between the plurality of wiring patterns; and
   forming a second insulation layer on the protection layer pattern and the first insulation layer to form an air gap between the plurality of wiring patterns.

2. The method of claim 1, wherein the UV pre-treatment process and forming the protection layer pattern are performed in a vacuum chamber.

3. The method of claim 1, wherein the reducing gas includes hydrogen gas and/or ammonia gas.

4. The method of claim 1, wherein the UV pre-treatment process is performed at a temperature of about 250° C. to about 400° C.

5. The method of claim 1, wherein the barrier layer includes Ta, TaN, TaC, TaCN, Ti, TiN and/or WN.

6. The method of claim 1, wherein the metal layer includes copper.

7. The method of claim 1, after performing the UV pre-treatment process, the method further comprising performing a plasma treatment process using ammonia gas.

8. The method of claim 7, wherein the UV pre-treatment process and the plasma treatment process are performed in vacuum chambers that are different from each other.

9. The method of claim 1, wherein the protection layer pattern includes aluminum nitride and/or cobalt.

10. The method of claim 1, wherein forming the protection layer pattern comprises:
    forming the protection layer pattern using a metal nitride on the top surface of each of the plurality of wiring patterns; and
    forming a sacrificial layer pattern including a metal oxynitride on the first insulation layer.

11. The method of claim 10, wherein forming the protection layer pattern comprises performing a chemical vapor deposition (CVD) process using an aluminum nitride precursor to form the sacrificial layer pattern including aluminum oxynitride and the protection layer pattern including aluminum nitride.

12. The method of claim 10, wherein the sacrificial layer pattern is etched prior to partially removing the first insulation layer.

* * * * *